(12) United States Patent
Ueda

(10) Patent No.: US 7,489,230 B2
(45) Date of Patent: Feb. 10, 2009

(54) SEMICONDUCTOR DEVICE AND METHOD OF MANUFACTURING THE SAME

(75) Inventor: Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 204 days.

(21) Appl. No.: 11/514,144

(22) Filed: Sep. 1, 2006

(65) Prior Publication Data

US 2007/0052515 A1 Mar. 8, 2007

(30) Foreign Application Priority Data

Sep. 5, 2005 (JP) .............................. 2005-256799

(51) Int. Cl.
*H01H 85/044* (2006.01)
*H01H 85/046* (2006.01)
*H01L 27/10* (2006.01)

(52) U.S. Cl. ................... 337/297; 337/401; 337/416; 257/209; 257/529

(58) Field of Classification Search ................. 337/401, 337/416, 297; 257/209, 529
See application file for complete search history.

(56) References Cited

U.S. PATENT DOCUMENTS

| | | | | |
|---|---|---|---|---|
| 4,814,853 A | * | 3/1989 | Uchida | 257/530 |
| 4,910,418 A | * | 3/1990 | Graham et al. | 326/38 |
| 5,949,323 A | * | 9/1999 | Huggins et al. | 337/401 |
| 6,008,716 A | * | 12/1999 | Kokubun | 337/297 |
| 6,225,652 B1 | * | 5/2001 | Devanney | 257/209 |
| 6,566,730 B1 | * | 5/2003 | Giust et al. | 257/529 |
| 6,661,330 B1 | * | 12/2003 | Young | 337/297 |
| 6,731,005 B2 | * | 5/2004 | Koyama et al. | 257/758 |
| 7,282,751 B2 | * | 10/2007 | Ueda | 257/209 |

FOREIGN PATENT DOCUMENTS

| JP | 2005-39220 | 2/2005 |
|---|---|---|
| JP | 2005-57186 | 3/2005 |

* cited by examiner

*Primary Examiner*—Anatoly Vortman
(74) *Attorney, Agent, or Firm*—Young & Thompson

(57) ABSTRACT

A semiconductor device includes a first insulating layer, which is formed on a semiconductor substrate (not shown), and formed with a concave portion, and an electric fuse which has a conductive member, a first terminal provided on one end and a second terminal provided on the other end of the conductive member, and which is provided on the first insulating layer. The first insulating layer is embedded with the conductive member. The conductive member has a flowing-out region in which a material forming the conductive member flows out to the outside of the concave portion, and is cut at a location different from the flowing-out region.

20 Claims, 19 Drawing Sheets

SEMICONDUCTOR DEVICE AND METHOD OF MANUFACTURING THE SAME

This application is based on Japanese Patent application No. 2005-256799, the content of which is incorporated hereinto by reference.

BACKGROUND

1. Technical Field

The present invention relates to a semiconductor device and a method of manufacturing the same, and, more particularly, to a semiconductor device including an electric fuse, and a method of manufacturing the same.

2. Related Art

Conventionally, there has been known a technology according to which a fuse is installed in a semiconductor device, the fuse is cut to adjust a resistance value used in the semiconductor device, to remove a defective element for replacement by a normal element, and the like.

In order to cut a fuse, there has been used a method, by which a fuse is cut by irradiating a part of the fuse with beams of laser light, or a method of cutting a fuse by use of an electric current.

Japanese Laid-Open patent publication No. 2005-39220, has disclosed a fuse which can be cut by a smaller electric current. In Japanese Laid-Open patent publication No. 2005-39220, a conductive material forming the fuse is shaped to be folded up a plurality of times. FIG. 19 is a plan view showing the fuse disclosed in Japanese Laid-Open patent publication No. 2005-39220. Here, a fuse 1100 is folded up twice.

The fuse 1100 has a current flowing-in terminal 1101, and a current flowing-out terminal 1102, and is provided further with a first one-way straight-line portion 1103, an another-way straight-line portion 1104, and a second one-way straight-line portion 1113 between the current flowing-in terminal 1101 and the current flowing-out terminal 1102. The fuse 1100 further includes a first right-angle connecting portion 1106 linking the first one-way straight-line portion 1103 and the another-way straight-line portion 1104, and a second right-angle connecting portion 1107 linking the second one-way straight-line portion 1113 and the another-way straight-line portion 1104.

In the fuse 1100 with the above-described configuration, when a predetermined electric current is applied to the current flowing-out terminal 1102 from the current flowing-in terminal 1101, cutting the another-way straight-line portion 1104 between the diagonally shaded portion 1109 is accelerated by adding heat generated in a diagonally shaded portion 1108 in the outer portion of the fuse 1100 to heat generated in the diagonally shaded portion 1109 in the inner portion of the fuse 1100. Thereby, the fuse 1100 is easily cut.

Moreover, Japanese Laid-Open patent publication No. 2005-57186, has disclosed a configuration in which, when an electric current is applied to a fuse, heat generated in a portion of the fuse, which is to be cut, is trapped or accumulated in the neighborhood of the portion in the fuse, which is to be cut, by enclosing the portion with a plate.

In Japanese Laid-open patent publication No. 2005-39220 and Japanese Laid-open patent publication No. 2005-57186, a fuse is heated to melt a material forming the conductive material in the fuse, or a fuse is cut, using a movement phenomenon caused by electromigration, when a current is applied to the fuse.

Incidentally, when a fuse is formed with a material which moves by the electromigration, it may be considered that material movement by the electromigration causes reconnection at a cut part when heat-treating of a semiconductor device is executed after the fuse is cut. If such reconnection is caused, a correct result will not be obtained at detecting whether the electric fuse is cut even, if the electric fuse to be cut has been cut.

Though it is thought that a possibility that the above-described reconnection is caused is not so high, and there is no problem at ordinary use, it is required to improve a holding characteristic by which a state, in which an electric fuse is cut, is held, when demand for the higher reliability of a semiconductor device is much increased or when a semiconductor device is used under severe conditions, or the like.

SUMMARY OF THE INVENTION

The present inventor has found a new method by which a fuse is cut by an electric current, wherein the new method is different from conventional methods of cutting a fuse.

The inventor has found a new method of cutting a fuse, by which, when an electric fuse is cut, a large cut part is formed at other regions different from a region, by a configuration in which a material forming the electric fuse is forced to flow out to the outside at a part of the electric fuse, and movement and supply of the material get out of balance each other by controlling the configuration of a semiconductor device including the electric fuse, a method of applying an voltage to the electric fuse, and the like. Thereby, a state, in which an electric fuse is cut, may be preferably held.

According to the present invention, there is provided a semiconductor device, including: a semiconductor substrate; a first insulating layer which is formed on the semiconductor substrate and formed with a concave portion; and an electric fuse which has a conductive member, a first terminal provided on one end of the conductive member and a second terminal provided on the other end of the conductive member, the electric fuse being formed on the first insulating layer such that the concave portion of the first insulating layer is embedded with the conductive member, and the conductive member having a flowing-out region in which a material forming the conductive member flows out into the outside of the concave portion and being cut at a location different from the flowing-out region.

According to the semiconductor device of the present invention, a large cut part may be formed because a part of the conductive material in the electric fuse as a location to be cut flows out to the outside of the concave portion. Moreover, a possibility that the electric fuse, which has been cut, is reconnected may be remarkably reduced because the conductive material is cut at a location different from the flowing-out region.

According to the present invention, there is provided a semiconductor device, including: a semiconductor substrate; a first insulating layer which is formed on the semiconductor substrate and formed with a concave portion; and an electric fuse which has a conductive member, a first terminal provided on one end of the conductive member and a second terminal provided on the other end of the conductive member, the electric fuse being provided on the first insulating layer such that the concave portion of the first insulating layer is embedded with the conductive member, and the conductive member having an expected flowing-out region in which a material forming the conductive member flows out into the outside of the concave portion when an electric current exceeding a predetermined current value is applied to between the first and the second terminals, and an expected cut region which is cut, based on a configuration in which the material flows out from the expected flowing-out region and the material in the concave portion moves in the direction to the expected flowing-out region.

According to the present invention, there is provided a method of manufacturing a semiconductor device including an electric fuse which is formed on a semiconductor substrate, and has a conductive member, a first terminal provided on one end, and a second terminal provided on the other end of the conductive member, including applying an electric current to the conductive member by applying a predetermined voltage to between the first terminal and the second terminal of the electric fuse, wherein in the applying an electric current to the conductive member, the conductive member is cut in regions different from one region, based on a configuration in which a material forming the conductive member flows out in one region of the conductive member and the material is moved in the direction to the one region.

Thus, a large cut part may be formed on regions different from one region because a material forming the conductive material flows out to the outside in the one region by cutting the electric fuse. Thereby, the electric fuse may be surely cut, and, at the same time, the cut state may be preferably maintained.

According to the present invention, a state, in which an electric fuse is cut, may be preferably held.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In an embodiment according to the present invention, an electric fuse may be cut by the following techniques. It may be assumed that the electric fuse may have a configuration in which the fuse is formed with, for example, a conductive member formed with a conductive material, and the surrounding surface in the cross-sectional direction of the conductive member is covered with a coating layer.

An electric current is applied to the electric fuse by impressing excessive power to the electric fuse to be cut, and a material forming the fuse is expanded. When the material forming the fuse is expanded, a crack and the like are generated on the surrounding coating layer. Furthermore, the material forming the fuse is expanded, and is forced to flow out into the crack in the surrounding coating layer. Thus, movement and supply of the material forming the fuse get out of balance each other, and a large cut part is formed at a region different from the region in which the material forming the fuse has flown out. Hereinafter, cutting of an electric fuse according to the above-described technique is called, "crack assist type cutting".

First Embodiment

Figure 1A:
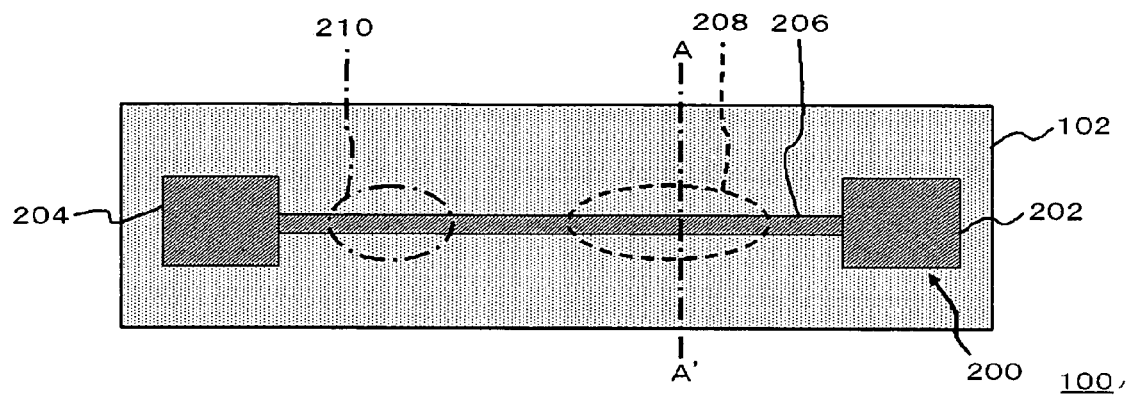
FIGS. 1A and 1B are plan views showing one example of a semiconductor device including an electric fuse according to an embodiment of the present invention.
Figure 1B:
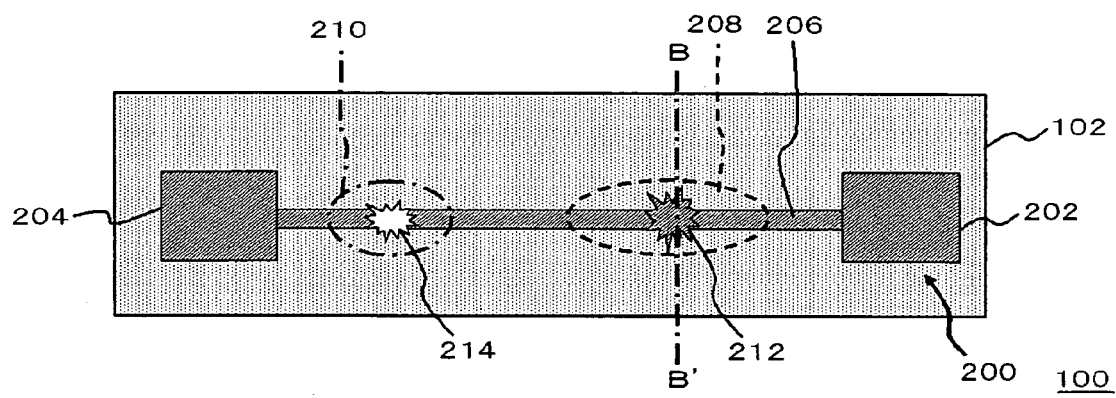

FIGS. 1A and 1B are plan views showing one example of a semiconductor device including an electric fuse.

A semiconductor device 100 includes: a semiconductor substrate (not shown); a first insulating layer 102 which is formed on the semiconductor substrate and formed with a concave portion; and an electric fuse 200 formed on the first insulating layer 102. The electric fuse 200 has a conductive member 206, a first terminal 202 provided at one end, and a second terminal 204 provided at the other end thereof. The conductive member 206 is formed in such a way that the concave portion of the first insulating layer 102 is embedded therewith. In the present embodiment, the electric fuse 200 is an electric fuse (E fuse) in which the conductive member 206 is cut by applying an electric current to between the first terminal 202 and the second terminal 204.

FIG. 1A shows a configuration of the electric fuse 200 before cutting. As shown in FIG. 1A, the conductive member 206 has an expected flowing-out region 208 and an expected cut region 210. The expected flowing-out region 208 is a region in which a material forming the conductive member 206 (hereinafter, it is called a fuse forming material) flows out to the outside of the concave portion when an electric current exceeding a predetermined current value is applied to between the first terminal 202 and the second terminal 204. Moreover, the expected cut region 210 is a region which is cut because a material forming the fuse in the concave portion is rapidly moved in the direction to the expected flowing-out region 208 after a material forming the fuse flows out from the expected flowing-out region 208.

FIG. 1B shows a configuration of the electric fuse 200 after cutting.

As shown in FIG. 1B, the conductive member 206 has a flowing-out region 212 in which a fuse forming material flows out into the outside of the concave portion, and a cut part 214 is formed in a part different from the flowing-out region 212.

Figure 2:
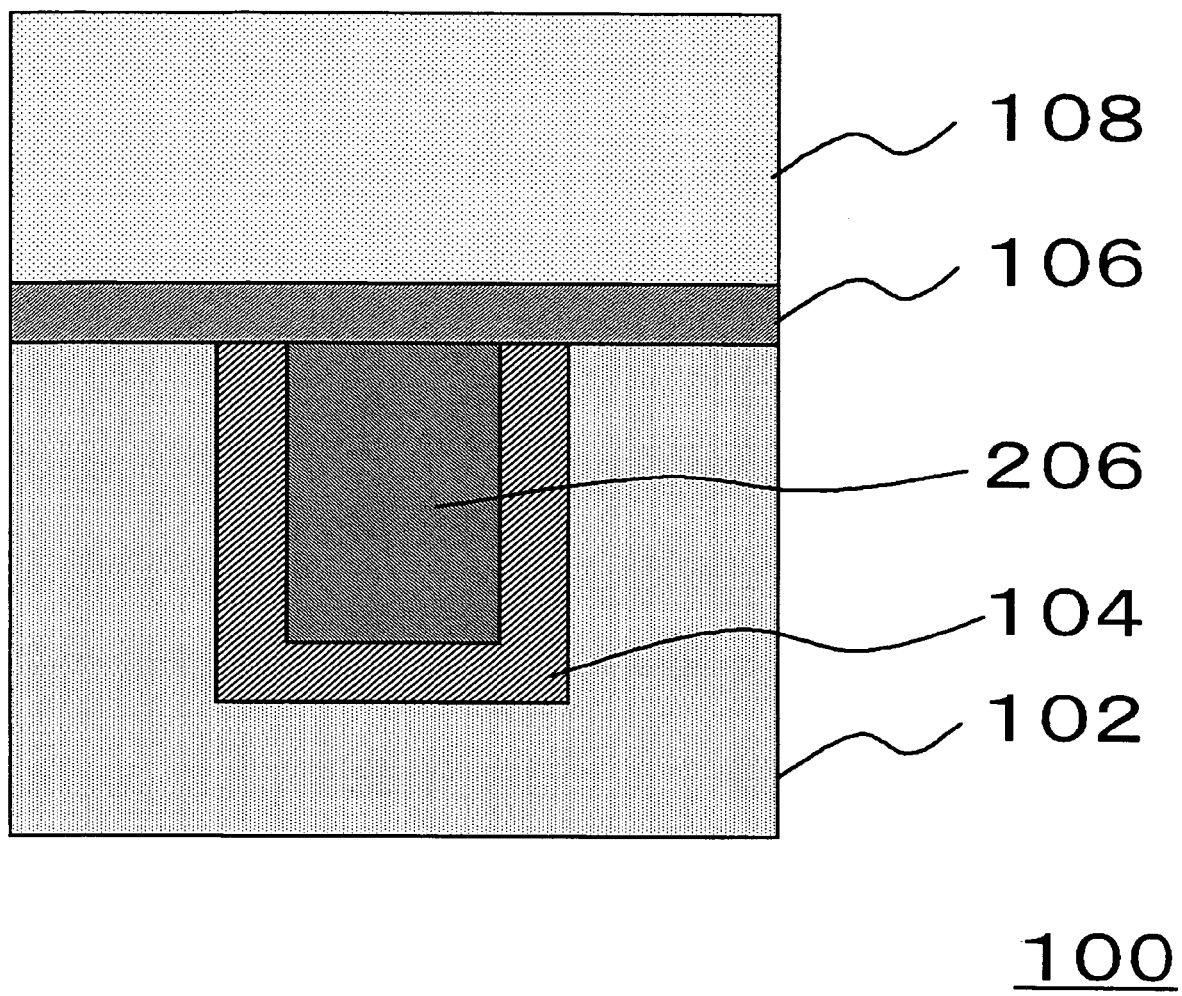
FIG. 2 is a cross-sectional view taken along the A-A' line in FIG. 1A.

FIG. 2 is a cross-sectional view taken along the A-A' line in FIG. 1A.

In the present embodiment, the semiconductor device 100 further includes above the first insulating layer 102: a first coating layer 106 formed on the upper surface of the conductive member 206; a second coating layer 104 formed on the side surface and the bottom surface of a concave portion formed on the first insulating layer 102; and a second insulating layer 108 formed on the first coating layer 106. The conductive member 206 is formed on the second coating layer 104 in the concave portion formed above the first insulating layer 102. The surface of the conductive member 206 has a configuration in which, in a cross-section in the stacking direction of the semiconductor substrate, a part of regions on the surface is covered with the first coating layer 106, and, at the same time, the other regions are covered with the second coating layer 104.

The first insulating layer 102 may be any levels of insulating layers provided on the semiconductor substrate, for example an element-isolation insulating layer, any insulating interlayer with a multilayered interconnect structure, an insulating layer formed at the bottom of a trench, and the like.

In the present embodiment, the conductive member 206 may be configured to be a copper containing metal film including copper as a main constituent. The copper containing metal film may include silver. Furthermore, the copper containing metal film may be configured to include one or more different types of elements selected from Al, Au, Pt, Cr, Mo, W, Mg, Be, Zn, Pd, Cd, Hg, Si, Zr, Ti, or, Sn. The copper containing metal film may be formed, using, for example, a plating method. Moreover, for example, a silicide film may be configured to be formed on the surface of the conductive member 206.

The first coating layer 106 is formed with a material different from that of the second coating layer 104. The material of the first coating layer 106 may be configured to be different from that of the second coating layer 104 in, for example, viscosity and/or young's modulus. The second coating layer 104 may be formed with a barrier metal film of, for example, Ta, TaN, Ti, TiN, W, and WN. The barrier metal film may be formed according to a sputtering method, a chemical-vapor deposition (CVD) method, and the like. The first coating layer 106 may be formed with a barrier insulating film of, for example, SiCN, SiN, SiC, SiOF, and SiON. The barrier insulating film may be formed according to the CVD method, and the like. The first coating layer 106 may be formed with a material which causes a crack when an electric current is applied to the electric fuse 200.

In the present embodiment, the first coating layer 106 may be formed with a material softer than that of the second coating layer 104. Here, a soft material represents, for example, a material with a low young's modulus and low viscosity. The first coating layer 106 may be formed with, for example, a material having a lower young's modulus than that of the material in the second coating layer 104. The layer thickness of the first coating layer 106 may be configured to be, for example, 10 nanometers (nm) to 100 nm. Moreover, the layer thickness of the second coating layer 104 may be also configured to be, for example, 10 nm to 100 nm.

The first insulating layer 102 and the second insulating layer 108 may be also formed with, for example, an $SiO_2$ film, or a low dielectric film such as an SiOC film. Besides SiOC, polyhydrogensiloxane such as hydrogen silsesquioxane (HSQ), methyl silsesquioxane (MSQ), and methylated hydrogen silsesquioxane (MHSQ) aromatic organic material such as polyarylether (PAE) divinyl siloxane-bis-benzocyclobutene (BCB), and Silk (registered trademark); spin on glass (SOG), flowable oxide (FOX), Cytop, and benzocyclobutene (BCB) may be used as a low dielectric film. Moreover, a porous layer thereof may be used as the low dielectric film. The material of the first insulating layer 102 and that of the second insulating layer 108 may be configured to be either the same, or different from each other.

In the present embodiment, the second insulating layer 108 is configured to be formed with a material softer than that of the second coating layer 104. The second insulating layer 108 may be formed with, for example, a material having a lower young's modulus than that of the material in the second coating layer 104. Moreover, the second insulating layer 108 may be formed with a material softer than that of the first coating layer 106. Moreover, the first insulating layer 102 maybe formed with a layer softer than the second coating layer 104 and the first coating layer 106.

As one example, there may be considered a configuration in which the first insulating layer 102 is formed with an $SiO_2$ film or an SiOC film (with a young's modulus of about 12 GPa); the second coating layer 104 is formed with a TiN film (with a young's modulus of about 180 GPa); the first coating layer 106 is formed with an SiCN film (with a young's modulus of about 100 GPa; and the second insulating layer 108 is formed with an SiOC film (with a young's modulus of about 12 GPa or less).

Figure 3A:
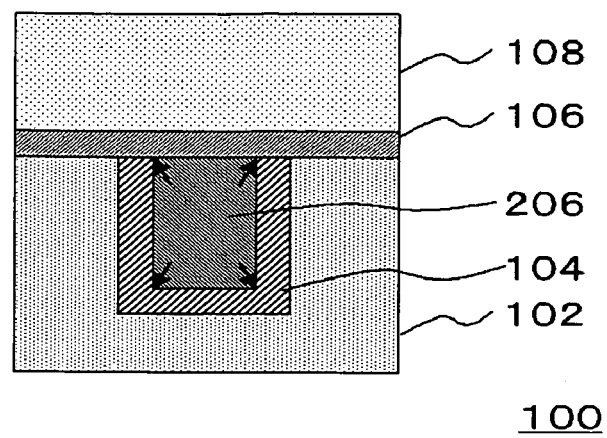
FIGS. 3A to 3D are cross-sectional views explaining a cutting mechanism.
Figure 3B:
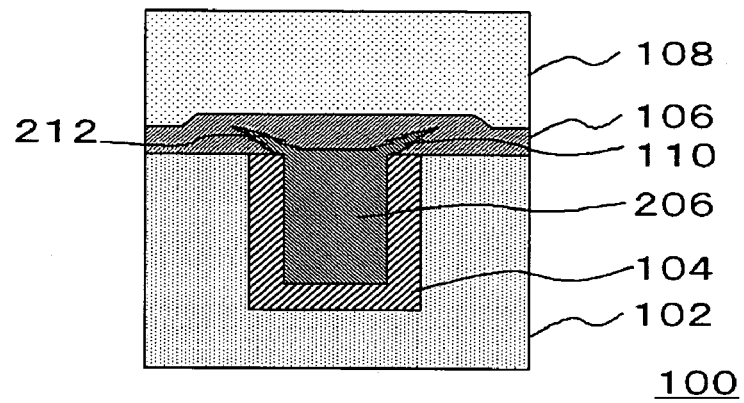
Figure 3C:
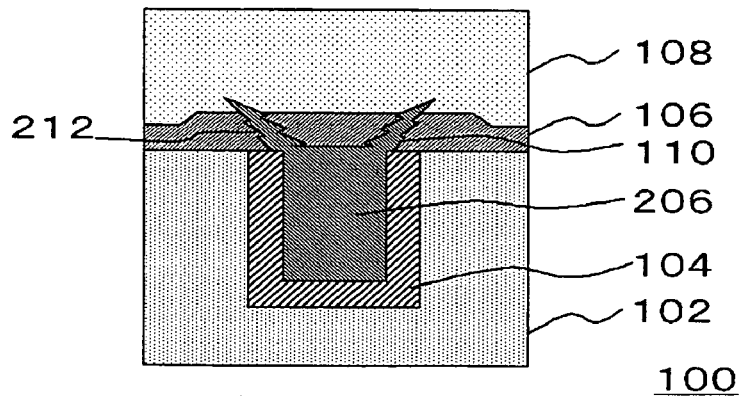
Figure 3D:
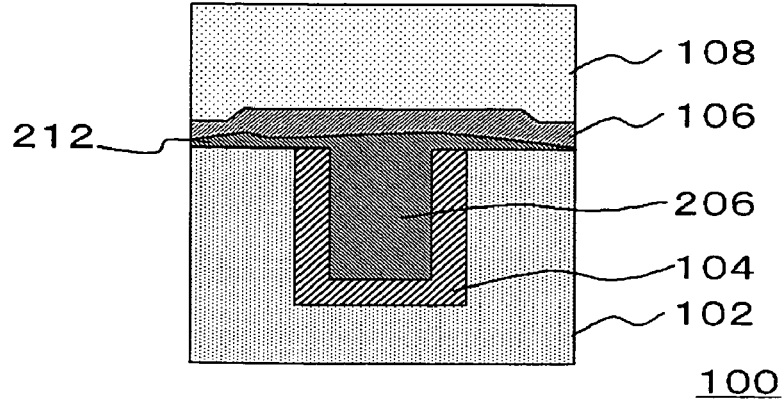
Figure 4A:
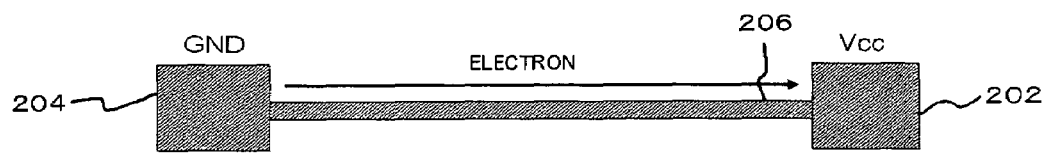
FIGS. 4A to 4C are schematic views showing the mechanism by which a conductive material is cut.
Figure 4B:
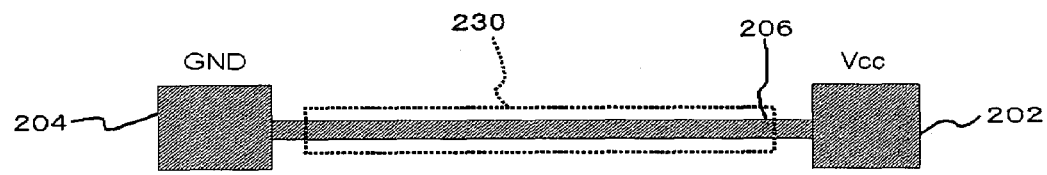
Figure 4C:
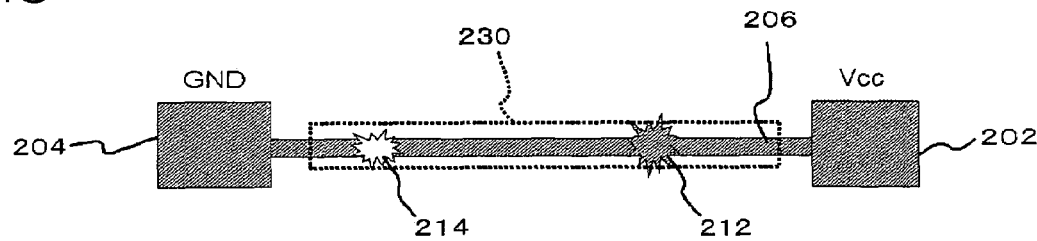

Subsequently, a mechanism in which the electric fuse 200 is cut by the crack assist type cutting in the semiconductor device 100 with the above-described configuration will be explained, referring to FIGS. 3A to 3D, and 4A to 4C. FIG. 3A is a cross-sectional view taken along the A-A' line in FIG. 1A. FIGS. 3B to 3D are a cross-sectional view taken along the B-B' line in FIG. 1B. FIGS. 4A to 4C are a schematic view of the electric fuse 200. Hereinafter, explanation will be made, further referring to FIGS. 1A and 1B.

When $V_{cc}$ is applied to the first terminal 202, and the second terminal 204 is grounded, an electric current flows in the direction from the first terminal 202 to the second terminal 204. At this time, electrons move in the direction from the second terminal 204 to the first terminal 202. When an electric current exceeding a predetermined current value flows between the first terminal 202 and the second terminal 204, the fuse forming material is heated to cause thermal expansion (FIGS. 3A and 4A).

Thus, a force caused by the fuse forming material, which has thermally expanded, is applied to the first coating layer 106 of the soft layer, among the coating layers coating the conductive member 206, to generate a crack in the first coating layer 106 (FIG. 3B). At this time, cracks may be generated all around the surrounding of the conductive member 206 (crack generated portion 230 in FIG. 4B).

When the fuse forming material is further heated, the fuse forming material flows into a large crack among cracks formed in the crack generated portion 230. Thereby, the flowing-out region 212 is formed. As the fuse forming material rapidly moves in the direction to the flowing-out region 212 at this time, the conductive member 206 is cut at a location at which the flowing-in material forming the fuse can not catch up with the flowing-out one. According to the above-described mechanism, the cut part 214 is formed at a location away from the flowing-out region 212 to some extent (FIG. 4C).

FIG. 3C is a view showing a cross-sectional structure in which a crack 110 is also generated in the second insulating layer 108. In this case, the fuse forming material flows into the crack 110, and the flowing-out region 212 and the cut part 214 are formed.

In some cases, the first coating layer 106 peels off from the first insulating layer 102, and a crevice is generated between the first insulating layer 102 and the first coating layer 106 as shown in FIG. 3D, because a force is applied in the direction to the first coating layer 106 by the fuse forming material, which has been thermally expanded. In this case, the fuse forming material flows into the crevice, and the flowing-out region 212 and the cut part 214 are also formed. FIGS. 3B to 3D, which have been explained above, correspond to the cross-sectional view taken along the B-B' line in FIG. 1B.

Figure 5A:
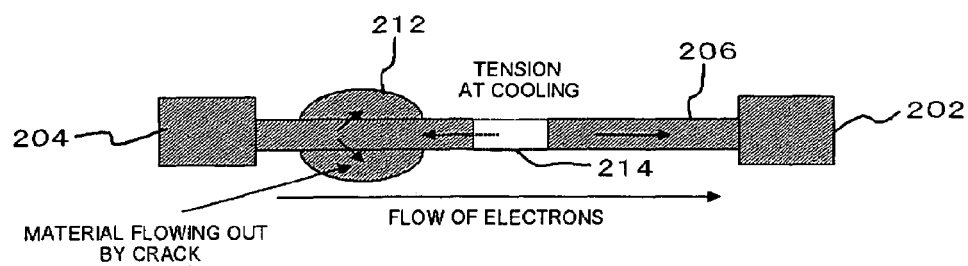
FIGS. 5A to 5C are views showing movement of a material forming the conductive member after the conductive member is cut.
Figure 5B:
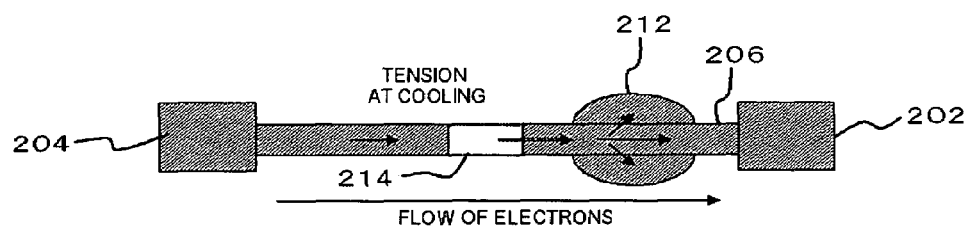
Figure 5C:
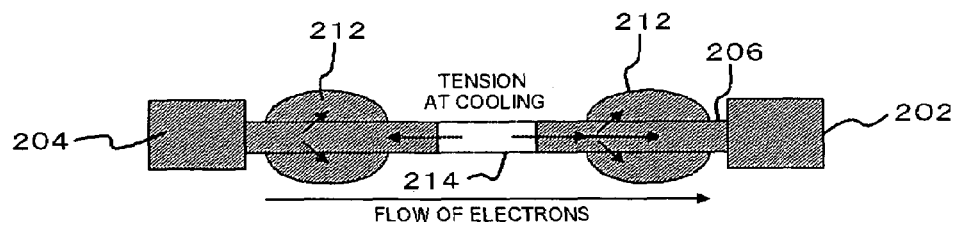

FIGS. 5A to 5C are views showing movement of the fuse forming material after the cut part 214 is generated in the conductive member 206.

When the cut part 214 is generated in the conductive member 206, an electric current does not flow in the conductive member 206, and the conductive member 206 is gradually cooled. At this time, for example, when the flowing-out region 212 is formed at a location nearer the second terminal 204 and away from the cut part 214 as shown in FIG. 5A, tension in the direction from the cut part 214 to the flowing-out region 212 is applied at cooling to between the flowing-out region 212 and the cut part 214, and the material forming the conductive member 206 moves in the direction to the flowing-out region 212. Moreover, the material moves in the direction to the first terminal 202 between the cut part 214 and the first terminal 202 under the influence of electron movement during current application to between the first terminal 202 and the second terminal 204. Thereby, the moving directions of the material are opposite to each other on both sides of the cut part 214, and the sufficiently large cut part 214 may be formed.

Moreover, for example, when the flowing-out region 212 is formed at a location nearer the first terminal 202 and away from the cut part 214 as shown in FIG. 5B, tension in the direction from the cut part 214 to the flowing-out region 212 is applied at cooling to between the cut part 214 and the flowing-out region 212, and the material forming the conductive member 206 moves in the direction to the flowing-out region 212. At this time, the material moves in the direction to the cut part 214 between the cut part 214 and the second terminal 204 under the influence of electron movement during current application to between the first terminal 202 and the second terminal 204. However, the moving amount of the material forming the conductive member 206 in the direction to the cut part 214 is very small, as compared to that of the material forming the conductive member 206 in the direction to the flowing-out region 212. Moreover, as the large amount of the material forming the conductive member 206 flows into the flowing-out region 212 at cutting the conductive member 206, the large cut part 214 may be formed. Thereby, the sufficiently large cut part 214 may be kept.

Moreover, for example, when the flowing-out regions 212 are formed at two locations, that is, between the cut part 214 and the first terminal 202, and the cut part 214 and the second terminal 204, as shown in FIG. 5C, pieces of tension are applied at cooling in the directions to the two flowing-out regions 212, and the material forming the conductive materials 206 moves in the direction to the two flowing-out regions 212. Thereby, the moving directions of the material are opposite to each other on both sides of the cut part 214, and the sufficiently large cut part 214 may be formed.

Returning to FIGS. 1A and 1B, the cut part 214 is inevitably formed in a region different from the flowing-out region 212 in the present embodiment, because the electric fuse 200 is cut by the above-described mechanism according to the crack assist type cutting. In the electric fuse 200 with the configuration shown in FIGS. 1A and 1B, the expected flowing-out region 208 and the expected cut region 210 may be arranged inversely, and the expected flowing-out region 208 and the expected cut region 210 may be provided at any locations on the conductive member 206. Moreover, the expected flowing-out region 208 and the expected cut region 210 have been shown in the drawings for explanation. However, the flowing-out region 212 and the cut part 214 are not necessarily formed at the shown locations, respectively.

The conductive member 206 in the electric fuse 200 may have a configuration in which the cut part 214 is formed at a portion different from the flowing-out region 212 when the flowing-out region 212 is formed at a part of the material 206.

For example, when the conductive member 206 has a straight-line structure as shown in FIGS. 1A and 1B, the length of the conductive member 206 in the current direction is required to be made longer to some extent. The length of the conductive member 206 may be assumed to be, for example, about 5 μm. Thereby, the flowing-out region 212 and the cut part 214 are formed at different positions from each other.

(Voltage Application to Electric Fuse)

In the present embodiment, the flowing-out region 212 is formed in the conductive member 206 by applying excessive power to the electric fuse 200, and, at the same time, the cut part 214 is generated as described above. In the present embodiment, for example, a voltage of about 2 volts to about 5 volts is applied to between the first terminal 202 and the second terminal 204. Thereby, in the semiconductor device 100 with the above-described configuration, the flowing-out region 212 and the cut part 214 may be formed in the electric fuse 200.

Figure 6:
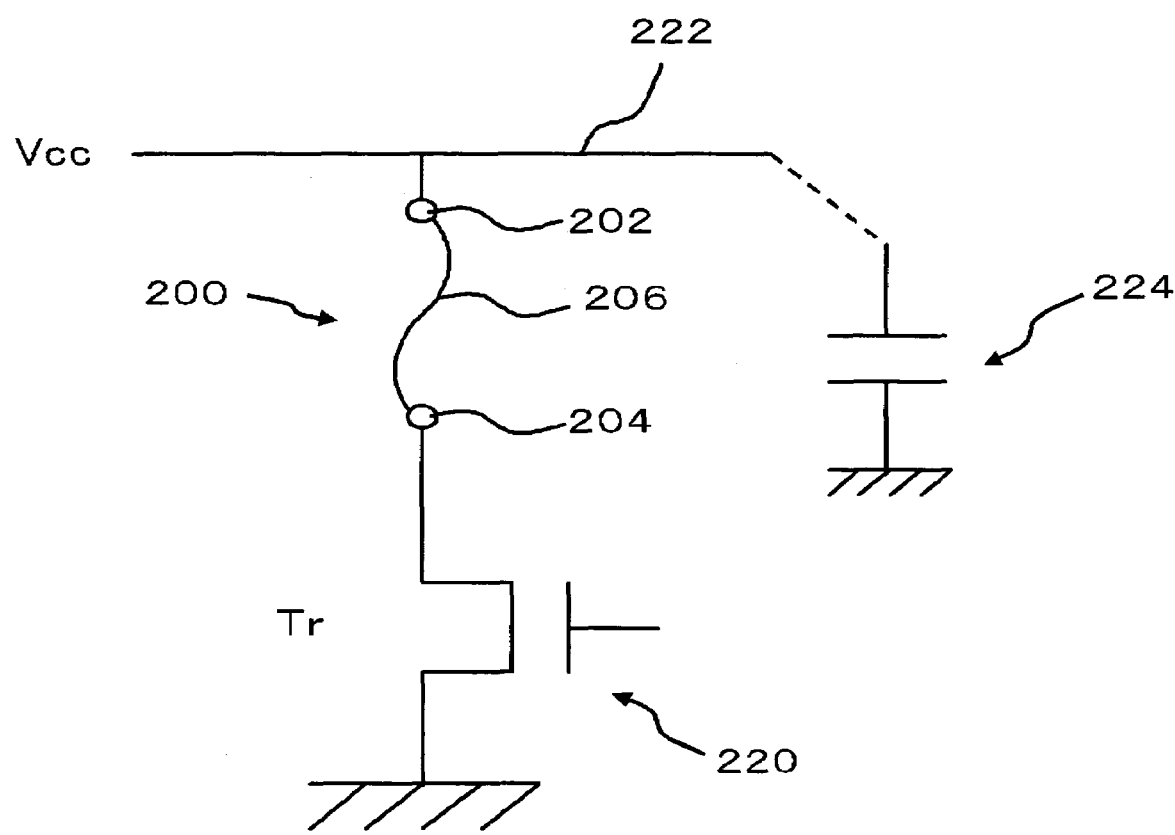
FIG. 6 is a view showing a circuit configuration of the semiconductor device including the electric fuse.

FIG. 6 is a view showing a circuit configuration of the semiconductor device 100 including the electric fuse 200.

The first terminal 202 of the electric fuse 200 is connected to a power supply line 222, and the second terminal 204 is connected to one of the source and the drain in the transistor 220. The other of the source and the drain is grounded. Moreover, the semiconductor device 100 has a plurality of electric fuses 200, and the plurality of electric fuses 200 are connected to the power supply line 222, which has not been shown. Therefore, there is caused a state in which stray capacitance 224 is added to the power supply line 222. A procedure by which the electric fuse 200 is cut in the circuit with the above-described configuration will be explained.

In the present embodiment, when the power supply line 222, and the transistor 220 are activated, the power supply voltage $V_{cc}$ is applied to the first terminal 202, and the second terminal 204 is grounded, that is, an electric current flows in the conductive member 206. Thus, there is generated a cut part in the conductive member 206. Here, there may be a configuration in which, when a voltage is applied to the electric fuse 200, the transistor 220 is activated after the power supply line 222 is activated.

Figure 7:
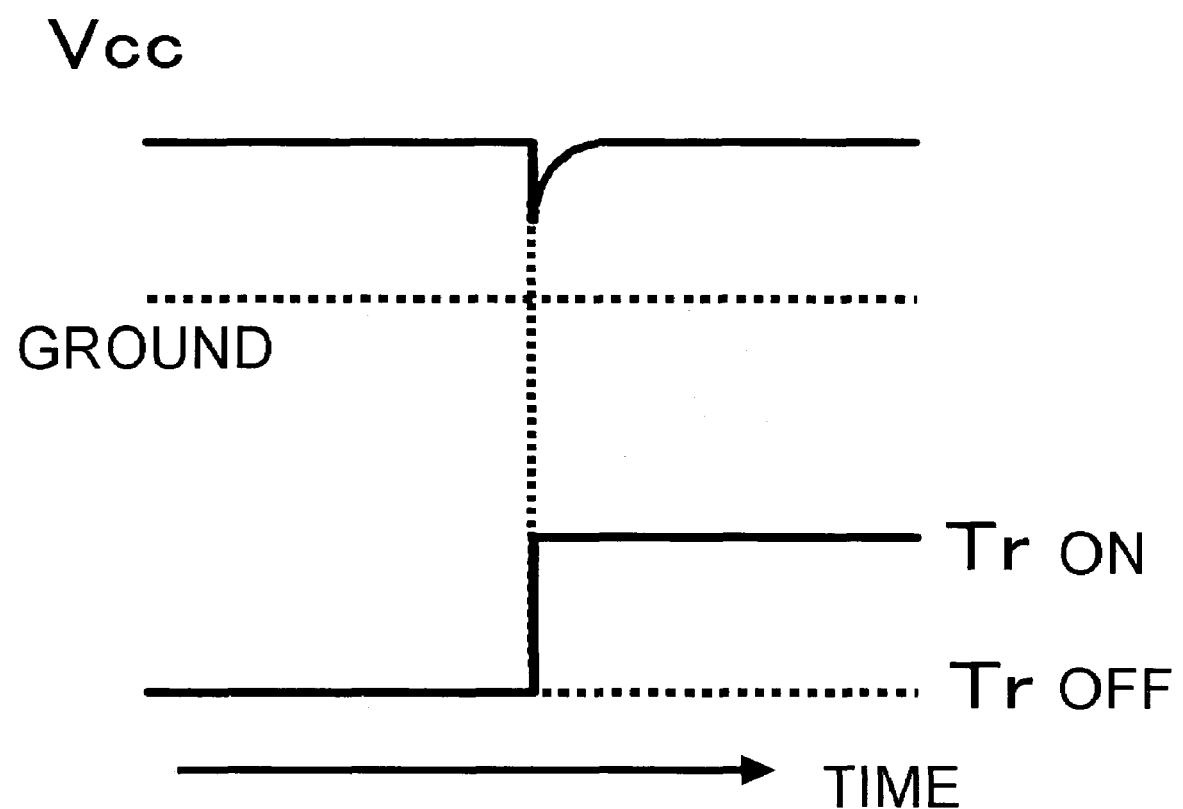
FIG. 7 is a view showing activating timing of a transistor, and voltage values applied to a first terminal of the electric fuse.

FIG. 7 is a view showing activating timing of a transistor, and voltage values applied to between the first terminal and the second terminal in the electric fuse.

When the transistor 220 is activated after the power supply line 222 is activated, instant voltage drop is generated by timing when the transistor 220 is activated, and the voltage value becomes $V_{cc}$ just after the drop. Thus, excessive power will be applied to the electric fuse 200 at a point when the transistor 220 is activated. Thereby, the conductive member 206 flows out to the outside of the concave portion in the first insulating layer 102, and the flowing-out region 212, and, at the same time, the large cut part 214 may be formed.

Figure 8:
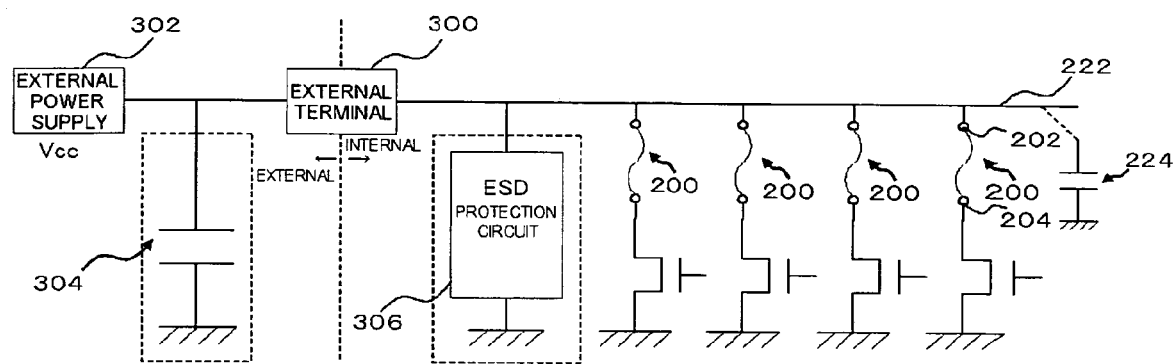
FIG. 8 is a view showing one example of the configuration of the semiconductor device according to an embodiment of the present invention.

FIG. 8 is a view showing another example of the circuit configuration of the semiconductor device 100 including the electric fuse 200.

Here, the first terminal 202 may be connected to a circuit having a sufficiently larger capacity than a charge amount reduced by cutting the electric fuse 200. The power supply line 222 is connected to an external power supply 302 through an external terminal 300. Furthermore, the power supply line 222 is connected to a circuit with a sufficiently large capacity such as an external capacitor 304 and an ESD protection circuit 306. The external capacitor 304 may be configured to be provided outside a chip such as a probe card. The power supply line 222 may be also configured to be connected to both of the external capacitor 304 and the ESD protection circuit 306, or to be connected to either of them.

Here, it is assumed that, for example, the capacity of the stray capacitance 224 is $C_o$, and the capacity of either of the external capacitor 304 and the ESD protection circuit 306, which is connected to the power supply line 222, is $C_1$. Moreover, when it is assumed that a value of a voltage supplied from the external power supply 302 is $V_{cc}$, an amount Q of charges accumulated in the semiconductor device 100 before cutting the electric fuse 200 is expressed as follows:

$$Q=(C_0+C_1) \times V_{cc}$$

When it is assumed that an electric current which flows at cutting of the electric fuse is $I_{cut}$, and time for cutting the electric fuse 200 is $T_{cut}$, the amount of reduced charges which are reduced by cutting the electric fuse 200 is expressed as follows:

$$\Delta Q = I_{cut} \times T_{cut}$$

$C_0$ and $C_1$, may be set in the present embodiment in such a way that the following formula (1) is satisfied:

$$\Delta Q/Q < 0.01 \quad \text{(FORMULA 1)}$$

Thereby, instant voltage drop which is generated, as shown in FIG. 7, by timing when the transistor 220 is activated may be controlled. Here, when a number of electric fuses 200 are connected to the power supply line 222, and the formula 1 is satisfied only with the capacity $C_o$ of the stray capacitance 224, there may be a configuration in which the external capacitor 304 and the ESD protection circuit 306 are not connected to the power supply line 222. Moreover, when the formula 1 is satisfied with the capacity $C_o$, and either of the external capacitor 304 and the ESD protection circuit 306, there may be a configuration in which only the selected one, that is, the either of the external capacitor 304 or the ESD protection circuit 306 is connected to the power supply line 222.

When it is assumed that the semiconductor device 100 has the above-described configuration, and a voltage is applied according to the procedure explained on referring to FIG. 7, the conductive member 206 is cut by an excessive power. Thereby, the conductive member 206 flows out to the outside of the concave portion in the first insulating layer 102, and the flowing-out region 212, and, at the same time, the large cut part 214 may be formed.

According to the above-described processing, there is manufactured the semiconductor device which includes the electric fuse 200, and in which the fuse forming material flows out in one region of the conductive member 206, and another material is moved in the direction to the one region to cut the conductive member 206 in a region different from the one region, wherein the electric fuse 200 is formed on the semiconductor substrate (not shown), and has the conductive member 206, and the first terminal 202 provided a tone end, and the second terminal 204 provided at the other end of the conductive member 206.

(Shape of Electric Fuse)

Subsequently, the configuration in which the electric fuse is preferably used in the present embodiment will be explained.

Figure 9A:
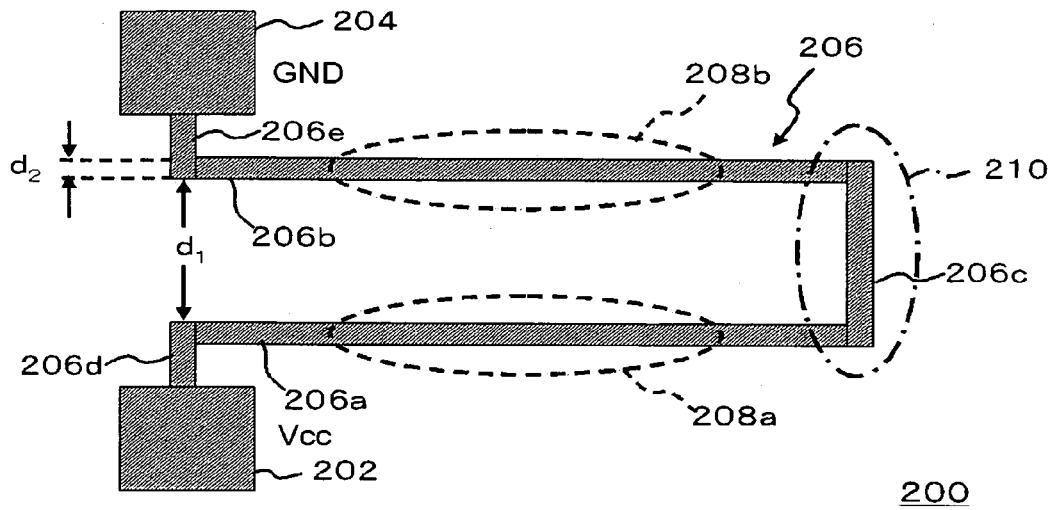
FIGS. 9A and 9B are plan views showing one example of the configuration of the electric fuse.
Figure 9B:
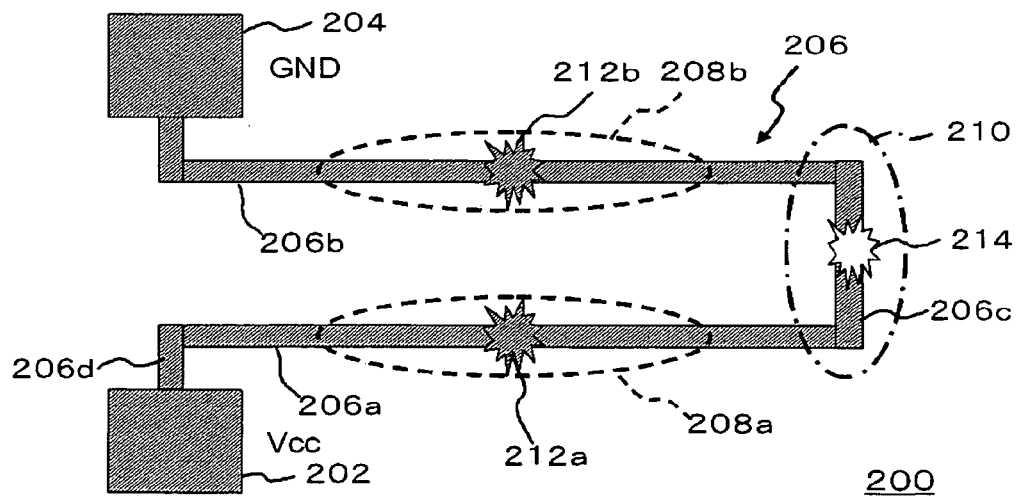

FIGS. 9A and 9B are plan views showing one example of the configuration of the electric fuse 200. FIG. 9A shows one example of the configuration of the electric fuse 200 before cutting, and FIG. 9B shows one example of the configuration of the electric fuse 200 after cutting.

The electric fuse 200 has a configuration in which there is a folded portion between the first terminal 202 and the second terminal 204. "Folding" represents a location at which the conductive member 206 is folded at an angle larger than ninety degrees.

The conductive member 206 includes: a straight line portion 206a; a straight line portion 206b; a connecting portion 206c connecting the straight line portion 206a and the straight line portion 206b; a connecting portion 206d connecting the straight line portion 206a and the first terminal 202; and a connecting portion 206e connecting the straight line portion 206b and the second terminal 204. The straight line portions 206a and 206b are arranged approximately in parallel with each other. Hereinafter, a traveling direction represents a direction from the first terminal 202 to the second terminal 204. The conductive member 206 bends about ninety degrees to the right side in the traveling direction at a connecting location of the connecting portion 206d and the straight line portion 206a. Then, the conductive member 206 bends about ninety degrees to the left side in the traveling direction at a connecting location of the straight line portion 206a and the connecting portion 206c, and, further, bends about ninety degrees to the left side in the traveling direction at a connecting location of the connecting portion 206c and the straight line portion 206b. Thereby, the conductive member 206 is folded 180 degrees, that is, folded one time. Moreover, the conductive member 206 bends about ninety degrees to the right side in the traveling direction at a connecting location of the straight line portion 206b and the connecting portion 206e. The electric fuse 200 has one folded portion. Here, the conductive member 206 is formed into a horizontally-tilted shape with the straight line portion 206a, the connecting portion 206c, and the straight line portion 206b. Moreover, the length of the straight line portion 206a and that of the straight line portion 206b in the current direction are longer than that of the connecting portion 206c. Furthermore, the length of the straight line portion 206a and that of the straight line portion 206b in the current direction also are longer than that of the connecting portion 206d and that of the connecting portion 206e.

In the present embodiment, the fuse forming material is heated, and is thermally expanded when an electric current flows between the first terminal 202 and the second terminal 204. The fuse forming material is thermally expanded to cause force which is applied to the surroundings thereof. At this time, as forces applied to each other between regions which are connected through a bent corner portion in the conductive member 206 are small, the materials forming the fuse are thermally expanded in the straight line portion 206a, the straight line portion 206b, the connecting portion 206c, the connecting portion 206d, and the connecting portion 206e, respectively, to apply the force to the surroundings thereof. Here, as the straight line portion 206a and the straight line portion 206b are longer than other parts, the area of the fuse forming material is larger than that of other components on the surface plane of the semiconductor substrate. Therefore, it is imagined that the force applied by the fuse forming material to the surroundings thereof is the maximum in the straight line portion 206a and in the straight line portion 206b.

In such a configuration, the straight line portion 206a and the straight line portion 206b have the highest possibility that the fuse forming material flows out to the outside of the concave portion. Accordingly, an expected flowing-out region 208a is formed on the straight line portion 206a, and an expected flowing-out region 208b is formed on the straight line portion 206b, as shown in FIG. 9A. Moreover, an expected cut region 210 is formed on the connecting portion 206c and the vicinity thereof.

FIG. 9B is a view showing a configuration in which, when an electric current is applied to between the first terminal 202 and the second terminal 204, the flowing-out region 212a is formed on the straight line portion 206a, the flowing-out region 212b is formed on the straight line portion 206b, and the cut part 214 is provided on the connecting portion 206c.

Incidentally, in the case of the conductive member 206 with a structure including the straight line portions 206a and 206b which are arranged in substantially parallel with each other as shown in the drawing, a distance $d_1$ between the straight line portion 206a and the straight line portion 206b is required to be a predetermined value or more. If the distance of the straight line portion 206a and the straight line portion 206b is not a way from each other, a possibility that there is continuity between the straight line portion 206a and the straight line portion 206b is caused by a configuration in which, for example, the flowing-out region 212a is extended to be also formed on the straight line portion 206b, similarly the flowing-out region 212b is extended to be also formed on the flowing-out region 212a, or the flowing-out region 212a and the flowing-out region 212b are connected to each other. When continuity between the straight line portion 206a and the straight line portion 206b is caused through the flowing-out region 212a and the flowing-out region 212b, a state in which the electric fuse 200 is cut is not generated even if the cut part 214 is formed on the connecting portion 206c. From the above viewpoint, the distance $d_1$ between the straight line portion 206a and the straight line portion 206b is preferably configured to be about three times or more as wide as the line width $d_2$ of the conductive member 206.

Here, though there is shown in FIG. 9B a configuration in which the flowing-out region 212a is on the straight line portion 206a, and the flowing-out region 212b is on the straight line portion 206b, there may be a configuration in which either of the flowing-out region 212a or the flowing-out region 212b is formed. Moreover, though the configuration shown in FIGS. 9A and 9B is illustrated because the configuration is considered to easily occur, the flowing-out region and the cut part 214 may be configured to be provided at any location on the conductive member 206. There may be considered a configuration, for example, in which a flowing-out region is formed on the connecting portion 206c, and a cut part is provided on a region excluding the connecting portion 206c in the conductive member 206.

According to the above-described configuration, it may be predicted and controlled to some degree what place in the conductive member 206 the flowing-out region is formed at, and what location is cut. Moreover, when the conductive member 206 has a straight-line structure as described above, the length of the conductive member 206 is required to be made longer to some extent in the present embodiment. A flexible arrangement may be realized by providing a folded portion in the conductive member 206.

Figure 10A:
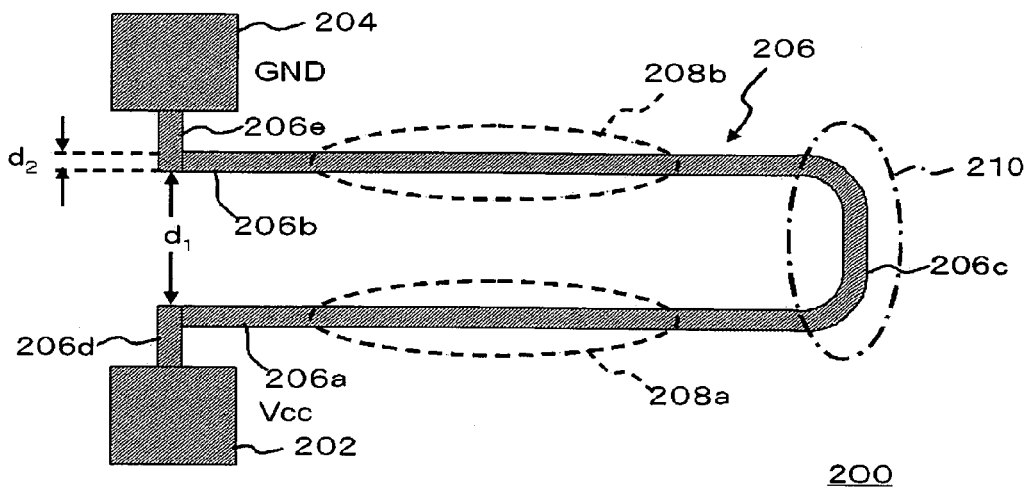
FIGS. 10A and 10B are plan views showing another example of the configuration of the electric fuse.
Figure 10B:
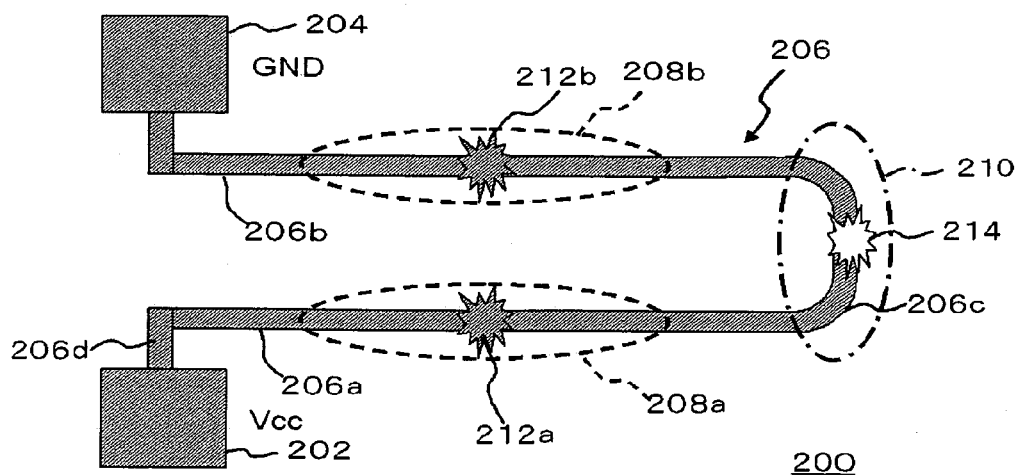

FIGS. 10A and 10B are plan views showing another example of the configuration of the electric fuse 200 in the present embodiment. FIG. 10A shows one example of the configuration of the electric fuse 200 before cutting, and FIG. 10B shows one example of the configuration of the electric fuse 200 after cutting. Even in these cases, the electric fuse 200 has one folded portion.

Here, the connecting portion 206c has a curved shape. The conductive member 206 is U-shaped. Even the above configuration may have a similar effect to that of the configuration shown in FIGS. 9A and 9B. The electric fuse 200 even in the present example has a similar configuration to the configuration which has been shown in FIGS. 9A and 9B, though the fuse in the present example differs from the one shown in FIGS. 9A and 9B only a point that the shapes of the connecting portions 206c are different from each other.

Figure 11:
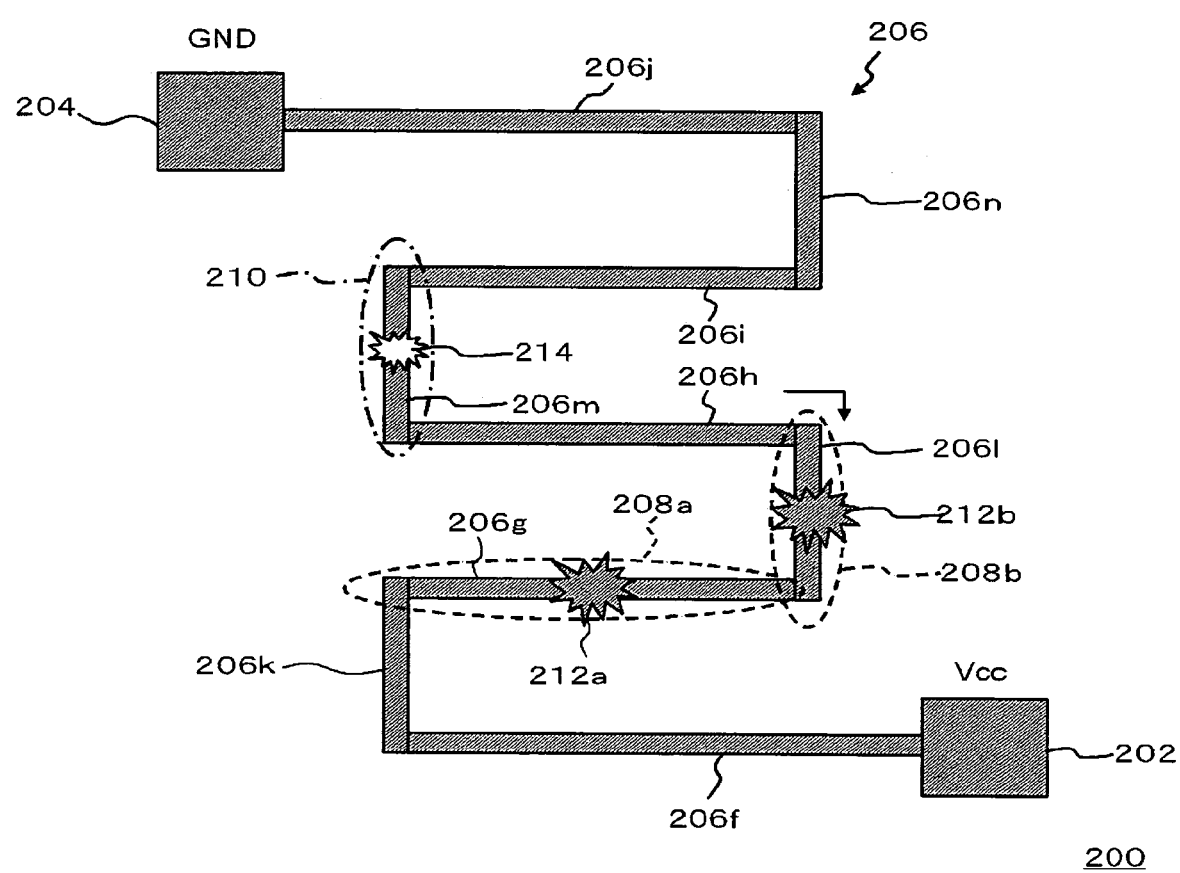
FIG. 11 is a plan view showing further another example of the configuration of the electric fuse.

FIG. 11 is a view showing further another example of the configuration of the electric fuse 200 in the present embodiment. Here, the electric fuse 200 has four folded portions.

The conductive member 206 includes: a straight line portion 206f; a straight line portion 206g; a straight line portion 206h; a straight line portion 206i; a straight line portion 206j; a connecting portion 206k connecting the straight line portion 206f and the straight line portion 206g; a connecting portion 206l connecting the straight line portion 206g and the straight line portion 206h; a connecting portion 206m connecting the straight line portion 206h and the straight line portion 206i; and a connecting portion 206n connecting the straight line portion 206i and the straight line portion 206j. The straight line portions 206f, 206g, 206h, 206i and 206j are arranged in substantially parallel with one another.

Hereinafter, the traveling direction represents a direction from the first terminal 202 to the second terminal 204. The conductive member 206 bends about ninety degrees to the right side in the traveling direction at a connecting location of the straight line portion 206f and the straight line portion 206k, and, then, bends about ninety degrees to the right side in the traveling direction at a connecting location of the straight line portion 206k and the straight line portion 206g again. Thereby, the conductive member 206 is folded about 180 degrees, that is, folded once. Moreover, the conductive member 206 bends about ninety degrees to the left side in the traveling direction at a connecting location of the straight line portion 206g and the straight line portion 206l, and, then, bends about ninety degrees to the left side in the traveling direction at a connecting location of the straight line portion 206l and the straight line portion 206h again. Thereby, the conductive member 206 is folded about 180 degrees again, that is, further folded once. Furthermore, the conductive member 206 bends about ninety degrees to the right side in the traveling direction between the straight line portion 206h and the connecting portion 206m, and, then, bends about ninety degrees to the right side in the traveling direction at a connecting location of the connecting portion 206m and the straight line portion 206i again. Thereby, the conductive member 206 is folded about 180 degrees again, that is, further folded once. Moreover, the conductive member 206 bends to the left side in the traveling direction at a connecting location of the straight line portion 206*i* and the connecting portion 206*n*, and, then, bends to the left side in the traveling direction at a connecting location of the connecting portion 206*n* and the straight line portion 206*j* again. Thereby, the conductive member 206 is folded about 180 degrees again, that is, further folded once.

Here, the expected flowing-out region 208*a* is provided on the straight line portion 206*g*, and the expected flowing-out region 208*b* is provided on the connecting portions 206*l*. The expected cut region 210 is provided at a location away from the expected flowing-out region 208*a* and the expected flowing-out region 208*b* to some extent. Moreover, in the configuration after cutting, the flowing-out region 212*a* is formed on the straight line portion 206*g*, and the flowing-out region 212*b* is formed on the connecting portion 206*l*. The cut part 214 is provided at a location away from the flowing-out region 212*a* and the flowing-out region 212*b* to some extent.

Even in the above-described configuration, straight line portions arranged approximately in parallel with each other may be arranged with a space therebetween by flowing-out regions, as explained on referring to FIGS. 9A and 9B, so that continuity between the straight line portions is not caused.

Here, the expected flowing-out region 208 and the expected cut region 210 have been shown in the drawings for explanation in the present embodiment. However, the flowing-out region 212 and the cut part 214 are not necessarily formed at the shown locations, respectively. The cut part 214 may be formed at a location different from that of the flowing-out region 212 by cutting the electric fuse 200 according to the above-explained mechanism of crack assist type cutting.

Second Embodiment

In the present embodiment, an electric fuse 200 has a configuration in which a flowing-out region 212 is easily formed, and, at the same time, a conductive member 206 is cut at a location away from the flowing-out region 212.

Figure 12:
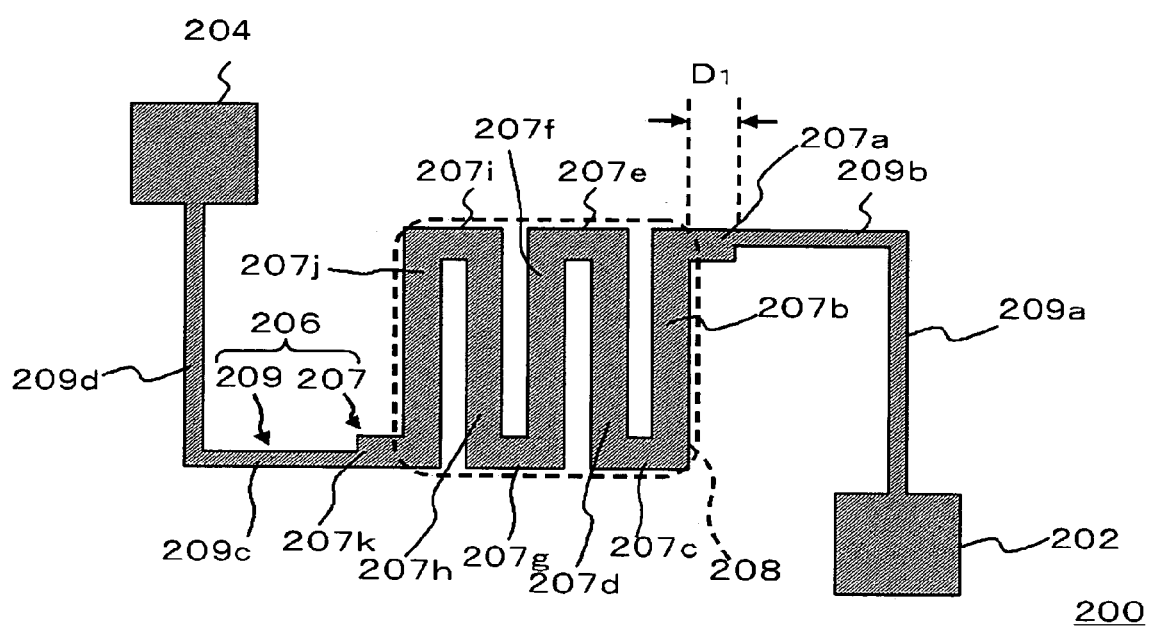
FIG. 12 is a plan view showing the configuration of the electric fuse included in the semiconductor device according to the embodiment of the present invention.

FIG. 12 is a plan view showing a configuration of the electric fuse included in a semiconductor device according to the present embodiment.

The electric fuse 200 includes: a conductive member 206 formed with a wide interconnect 207, and a narrow interconnect 209; a first terminal 202 formed at one end of the conductive member 206; and a second terminal 204 formed at the other end of the conductive member 206. The narrow interconnect 209 is formed to have a narrower interconnect width than that of the wide interconnect 207, wherein the interconnect width represents an interconnect width approximately perpendicular to a current direction (hereinafter, simply called "interconnect width"). Moreover, the electric fuse 200 has a juxtaposed region in which a plurality of straight line portions are juxtaposed with one another by folding of the wide interconnect 207. In the present embodiment, the juxtaposed region is an expected flowing-out region 208.

The narrow interconnect 209 is connected to the wide interconnect 207 outside the expected flowing-out region 208. The narrow interconnect 209 includes: a first narrow straight line portion 209*a* connected to the first terminal 202; a second narrow straight line portion 209*b* connected to the first narrow straight line portion 209*a*; a fourth narrow straight line portion 209*d* connected to the second terminal 204; and a third narrow straight line portion 209*c* connected to the fourth narrow straight line portion 209*d*. The wide interconnect 207 has a configuration in which a separation portion 207*a*, a wide straight line portion 207*b*, a wide connecting portion 207*c*, a wide straight line portion 207*d*, a wide connecting portion 207*e*, a wide straight line portion 207*f*, a wide connecting portion 207*g*, a wide straight line portion 207*h*, a wide connecting portion 207*i*, a wide straight line portion 207*j*, and a separation portion 207*k* are connected in this order between the second narrow straight line portion 209*b* and the third narrow straight line portion 209*c*. In the present embodiment, the wide straight line portion 207*b*, the wide straight line portion 207*d*, the wide straight line portion 207*f*, the wide straight line portion 207*h*, and the wide straight line portion 207*j* are arranged in substantially parallel with one another.

Hereinafter, a traveling direction represents a direction from the first terminal 202 to the second terminal 204. The conductive member 206 bends about ninety degrees to the left side in the traveling direction at a connecting location of the first narrow straight line portion 209*a* and the second narrow straight line portion 209*b*. The second narrow straight line portion 209*b* and the separation portion 207*a* are formed on the same straight line. The conductive member 206 bends about ninety degrees to the left side in the traveling direction at a connecting location of the separation portion 207*a* and the wide straight line portion 207*b*. Furthermore, the conductive member 206 bends about ninety degrees to the right side in the traveling direction at a connecting location of the wide straight line portion 207*b* and the wide connecting portion 207*c*, and, then, bends again about ninety degrees to the right side in the traveling direction at a connecting location of the wide connecting portion 207*c* and the wide straight line portion 207*d*. Similarly, the conductive member 206 bends about ninety degrees to the left side in the traveling direction at a connecting location of the wide straight line portion 207*d* and the wide connecting portion 207*e*, and, then, at a connecting location of the wide connecting portion 207*e* and the wide straight line portion 207*f*. Furthermore, the conductive member 206 bends about ninety degrees to the right side in the traveling direction at a connecting location of the wide straight line portion 207*f* and the wide connecting portion 207*g*, and, then, at a connecting location of the wide connecting portion 207*g* and the wide straight line portion 207*h*. The conductive member 206 bends about ninety degrees to the left side in the traveling direction at a connecting location of the wide straight line portion 207*h* and the wide connecting portion 207*i*, and, then, at a connecting location of the wide connecting portion 207*i* and the wide straight line portion 207*j*. Furthermore, the conductive member 206 bends about ninety degrees to the right side in the traveling direction at a connecting location of the wide straight line portion 207*j* and the separation portion 207*k*, and, then, at a connecting location of the third narrow straight line portion 209*c* and the fourth narrow straight line portion 209*d*. Thereby, the wide interconnect 207 is folded a plurality of times into a meandering shape in the expected flowing-out region 208. Here, "folding" represents a location at which the conductive member 206 is folded at an angle larger than ninety degrees. In the configuration shown in FIG. 12, the wide interconnect 207 is folded four times.

Figure 13A:
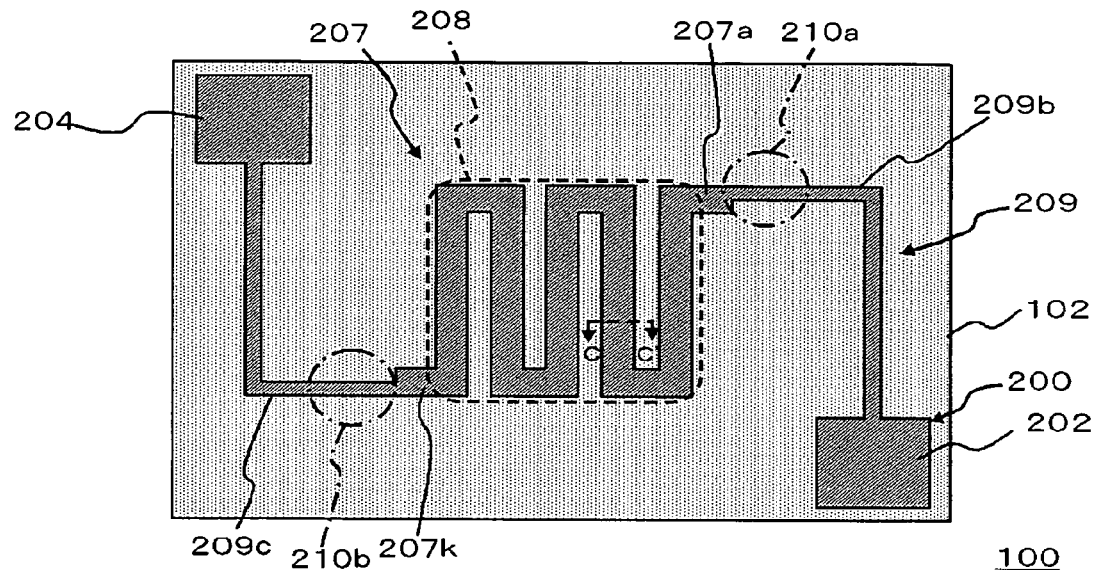
FIGS. 13A and 13B are plan views showing a configuration of the semiconductor device according to the embodiment of the present invention.
Figure 13B:
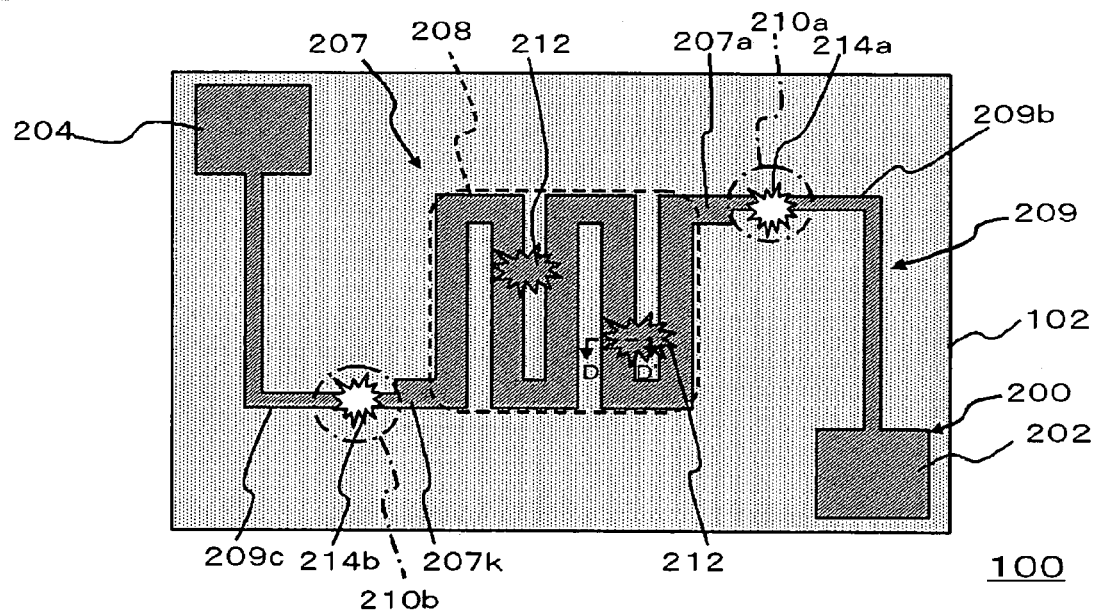

FIGS. 13A and 13B are plan views showing the configuration of the semiconductor device including the electric fuse 200 shown in FIG. 12. FIG. 13A shows the configuration of the semiconductor device 100 including the electric fuse 200 before cutting. FIG. 13B shows the configuration of the semiconductor device 100 including the electric fuse 200 after cutting.

The semiconductor device 100 includes: a semiconductor substrate (not shown); and a first insulating layer 102 which is formed on the semiconductor substrate and formed with a concave portion. The electric fuse 200 is formed on the first insulating layer 102, the conductive member 206 is formed in such a way that the concave portion on the first insulating layer 102 is embedded therewith.

The semiconductor 100 in the present embodiment has a similar configuration to the configuration which has been explained on referring to FIG. 2, though the semiconductor in the present embodiment differs from the one shown in FIG. 2 in only a point that the shapes of the electric fuses 200 are different from each other. FIG. 2 corresponds to the cross-sectional view taken along the C-C' line in FIG. 13A. Moreover, FIGS. 3B to 3D correspond to the cross-sectional view taken along the D-D' line in FIG. 13B. A first coating layer 106 is formed at least on the upper surface of the wide interconnect 207. Furthermore, at least the wide interconnect 207 is formed on a second coating layer 104 in the concave portion. Here, the first coating layer 106 and the second coating layer 104 may be also configured to be formed on the whole surface of the semiconductor substrate.

In the present embodiment, the wide interconnect 207 has a structure in which a plurality of straight line portions are folded in the expected flowing-out region 208. For example, the wide straight line portions 207d, 207f, 207h, and the like (refer to FIG. 12) are shaped to be enclosed on both sides by other straight line portions of the wide interconnect 207. Moreover, the wide straight line portions 207b and 207j are also adjacent with other straight line portions of the wide interconnect 207. In the present embodiment, as the folded structure of the wide interconnect 207 is formed in the expected flowing-out region 208, the conductive member 206 is kept at a comparatively high temperature in the expected flowing-out region 208 when an electric current flows in the conductive member 206. Accordingly, the fuse forming material expands easiest in the expected flowing-out region 208 in the electric fuse 200 according to the present embodiment. Therefore, a crack and the like are caused in the expected flowing-out region 208, and the expanded material forming the fuse easily flows out into the crack. When the fuse forming material in the expected flowing-out region 208 flows out to the outside, the fuse forming material moves in that direction. In the present embodiment, the wide interconnect 207 is prevented from being cut because the width of the wide interconnect 207 is formed wide. On the other hand, the narrow interconnect 209 is easily cut because the width of the interconnect 209 is formed narrow. Especially, the second narrow straight line portion 209b, and the third narrow straight line portion 209c are easily cut, which are directly connected to the wide interconnect 207.

As the fuse forming material flows out from the expected flowing-out region 208, and the fuse forming material in the concave portion rapidly moves in the direction to the expected flowing-out region 208 in the electric fuse 200, an expected cut region 210a to be cut is provided on the second narrow straight line portion 209b, and an expected cut region 210b to be cut is provided on the third narrow straight line portion 209c. Here, the expected region represents a region in which there is a high possibility that flowing-out is caused, or cutting is caused with a high possibility, and flowing out or cutting is not always caused in the expected region.

The width of the wide interconnect 207 is required to be formed wide to some extent in such a way that cutting is not caused in the wide interconnect 207. From the above viewpoint, the width of the wide interconnect 207 may be configured to be about 1.25 times or more as wide as the width of the narrow interconnect 209. On the other hand, heat in the folded portion is reduced, and an effect of selective flowing-out is reduced in the folded portion of the wide interconnect 207 when the width of the wide interconnect 207 is too thick. From such a viewpoint, the width of the wide interconnect 207 may be configured to be about two times or less as that of the narrow interconnect 209. The width of the wide interconnect 207 may be configured to be, for example, 0.16 μm. The width of the narrow interconnect 209 may be configured to be, for example, 0.12 μm. Thereby, even if the fuse forming material flows out to the outside, there may be a configuration in which cutting is not caused on the wide interconnect 207 and is caused on the narrow interconnect 209.

Moreover, the separation portion 207a and the separation portion 207k separate the narrow interconnect 209 from the expected flowing-out region 208. The fuse forming material which has flown out in the expected flowing-out region 208 may be prevented from reaching the cut part by providing the above separation portions 207a and 207k. Though the drawing shows a schematic view (hereinafter, the same with other drawings), the width $D_1$ (refer to FIG. 12) of the separation portion 207a and that of the separation portion 207k may be preferably configured to be about three times or more as that of the wide interconnect 207.

According to the above-described configuration, the cut part 214a and the cut part 214b may be formed at a location away from the flowing-out region 212. Accordingly, even when the flowing-out region 212 is formed across between the adjacent straight line portions in the expected flowing-out region 208, the electric fuse 200 may be surely cut.

Subsequently, the mechanism in which the electric fuse 200 is cut by the crack assist type cutting in the semiconductor device 100 in the present embodiment will be explained.

When $V_{cc}$ is applied to the first terminal 202, and the second terminal 204 is grounded, an electric current flows from the first terminal 202 to the second terminal 204. At this time, electrons move in the direction from the second terminal 204 to the first terminal 202. The fuse forming material is heated, and is thermally expanded by the electric current flowing between the first terminal 202 and the second terminal 204. In the present embodiment, the fuse forming material is heated and thermally expanded in the expected flowing-out region 208 in an easier way in comparison with other regions. Therefore, a large crack may be generated in the expected flowing-out region 208. When the fuse forming material is further heated and is expanded, the fuse forming material flows into a location in which the large crack is generated. Thus, the flowing-out region 212 is formed in the expected flowing-out region 208 as shown in FIG. 13B.

Moreover, as the separation portion 207a is formed between the expected flowing-out region 208 and the second narrow straight line portion 209b, and the separation portion 207k is formed between the expected flowing-out region 208 and the third narrow straight line portion 209c, the cut parts 214a and 214b may be generated at a location away from the expected flowing-out region 208.

Here, though there is shown in FIG. 13B a configuration in which the cut part 214a is provided on the second narrow straight line portion 209b and the cut part 214b is provided on the third narrow straight line portion 209c, there may be a configuration in which only a cut part is generated on either of the second narrow straight line portion 209b, or the third narrow straight line portion 209c. Also, here the cut part may be formed on the location other than that shown in the drawing, for example, on the first thin line portion 209a or the fourth narrow straight line portion 209d. Moreover, though an example in which the first narrow straight line portion 209a and the fourth narrow straight line portion 209d are formed with the narrow interconnect 209 has been shown in the present embodiment, the above portions may be formed with the wide interconnect 207.

(Variations)

Subsequently, variations of the semiconductor device 100 according to the present embodiment will be explained.

The electric fuse 200 may have a configuration in which, for example, there is included neither the first narrow straight line portion 209*a* nor the fourth narrow straight line portion 209*d*.

Figure 14A:
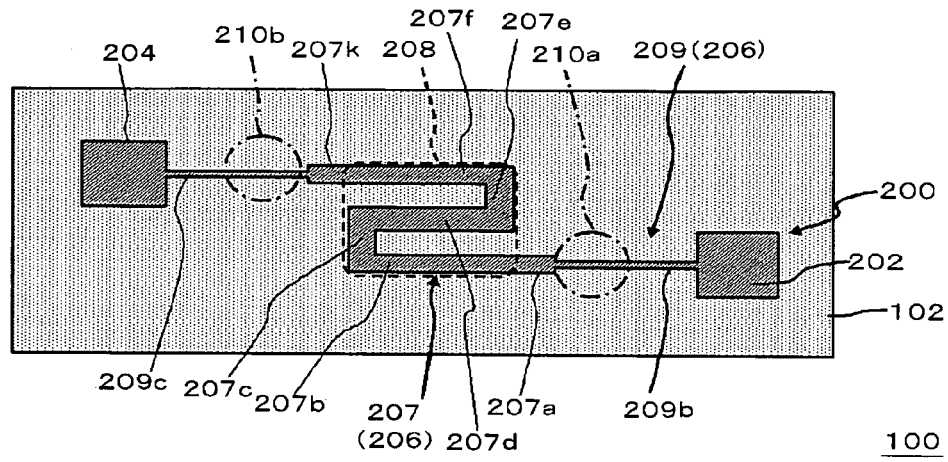
FIGS. 14A and 14B are plan views showing another example of the configuration of the semiconductor device according to the embodiment of the present invention.
Figure 14B:
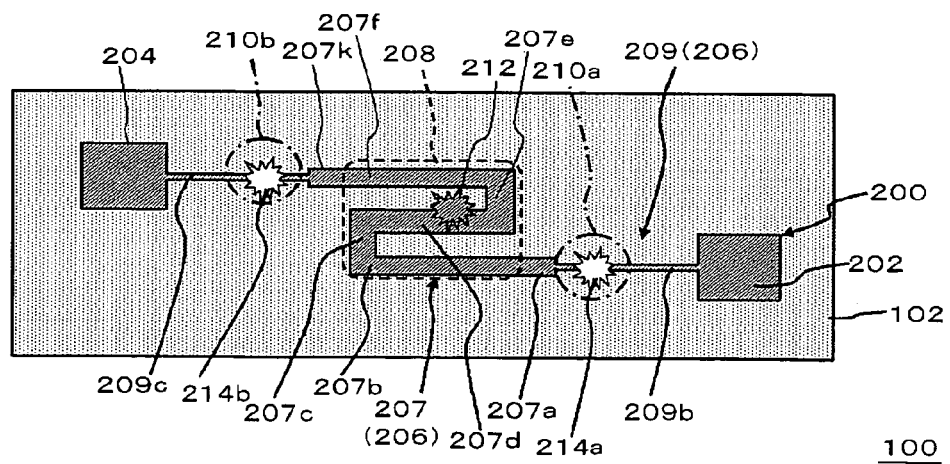

FIGS. 14A and 14B are plan views showing further another example of the semiconductor device 100 in the present embodiment. FIG. 14A shows one example of the configuration of the electric fuse 200 before cutting, and FIG. 14B shows one example of the configuration of the electric fuse 200 after cutting.

Here, the narrow interconnect 209 includes a second narrow straight line portion 209*b* connected to the first terminal 202, and a third straight line portion 209*c* connected to the second terminal 204. The wide interconnect 207 has a configuration in which the separation portion 207*a* (extending portion), the wide straight line portion 207*b*, the wide connecting portion 207*c*, the wide straight line portion 207*d*, the wide connecting portion 207*e*, the wide straight line portion 207*f*, and the separation portion 207*k* are connected in this order between the second narrow straight line portion 209*b* and the third narrow straight line portion 209*c*. The wide straight line portion 207*b*, the separation portion 207*a* and the second narrow straight line portion 209*b* are formed in such a way that they extend on the same straight line, and the wide straight line portion 207*f*, the separation portion 207*k* (extending portion), and the third narrow straight line portion 209*c* are formed in such a way that they extend on the same straight line.

Hereinafter, a traveling direction represents a direction from the first terminal 202 to the second terminal 204. The conductive member 206 is extending in one direction through the second narrow straight line portion 209*b*, the separation portion 207*a*, and the wide straight line portion 207*b*. The conductive member 206 bends about ninety degrees to the right side in the traveling direction at a connecting location of the wide straight line portion 207*b* and the wide connecting portion 207*c*, and, then, bends again about ninety degrees to the right side in the traveling direction at a connecting location of the wide connecting portion 207*c* and the wide straight line portion 207*d*. Thereby, the conductive member 206 is folded once. Similarly, the conductive member 206 bends about ninety degrees to the left side in the traveling direction at a connecting location of the wide straight line portion 207*d* and the wide connecting portion 207*e*, and, then, at a connecting location of the wide connecting portion 207*e* and the wide straight line portion 207*f*. Thereby, the wide interconnect 207 is folded two times into a meandering shape (inverted S shape) in the expected flowing-out region 208. Furthermore, the conductive member 206 is extending in one direction through the wide straight line portion 207*f*, the separation portion 207*k*, and the third narrow straight line portion 209*c*.

Even in the above-described configuration, the wide interconnect 207 is kept at a comparatively high temperature in the expected flowing-out region 208, because the wide interconnect 207 has a folded structure, and heat easily gathers into the region 208 when an electric current is applied to between the first terminal 202 and the second terminal 204. Therefore, the fuse forming material easily flows out in the expected flowing-out region 208. Moreover, as the interconnect width of the second narrow straight line portion 209*b* and that of the third narrow straight line portion 209*c* are formed narrower than that of the wide interconnect 207, a cut part is easily generated in the second narrow straight line portion 209*b* and the thin third straight line portion 209*c*. Furthermore, as the second narrow straight line portion 209*b* is separated from the expected flowing-out region 208 through the separation portion 207*a*, and the third narrow straight line portion 209*c* is separated from the expected flowing-out region 208 through the separation portion 207*k*, the flown-out material forming the fuse may be configured to be prevented from flowing into the cut part 214*a* and the cut part 214*b* when the flowing-out region 212 is formed in the expected flowing-out region 208.

Here, in the wide interconnect 207, a plurality of straight line portions and a plurality of connecting portions may be configured to have different interconnect widths from one another. For example, in the example shown in FIGS. 14A and 14B, the wide straight line portion 207*d* may be configured to have a wider interconnect width than that of the wide straight line portion 207*b* or that of the wide straight line portion 207*f*. According to the above-described configuration, there may be a configuration in which flowing out is easily generated in the wide straight line portion 207*d*, and, at the same time, cutting is hardly generated therein. Here, a straight line portion and a connecting portion, which form the wide interconnect 207, are formed so that their interconnect width is formed wider than that of the narrow interconnect 209 even in any cases. Moreover, it is preferable in the wide interconnect 207 that differences in the interconnect width between straight line portions and connecting portions do not change largely. The differences in the interconnect width between straight line portions and connecting portions are preferably within a range of, for example, 30% in the wide interconnect 207.

Figure 15A:
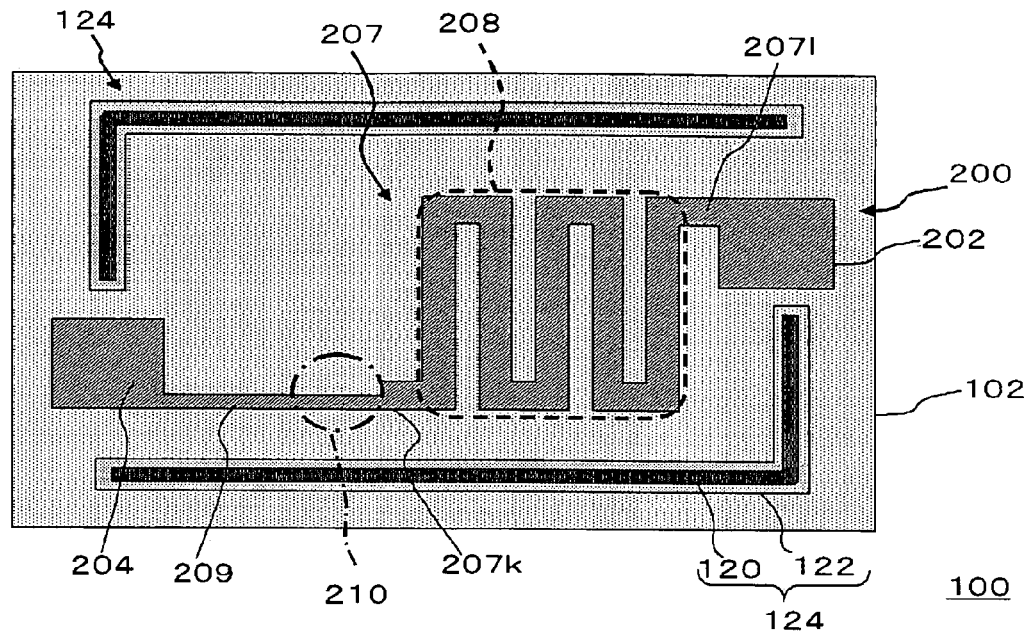
FIGS. 15A and 15B are plan views showing another example of the configuration of the semiconductor device according to the embodiment of the present invention.
Figure 15B:
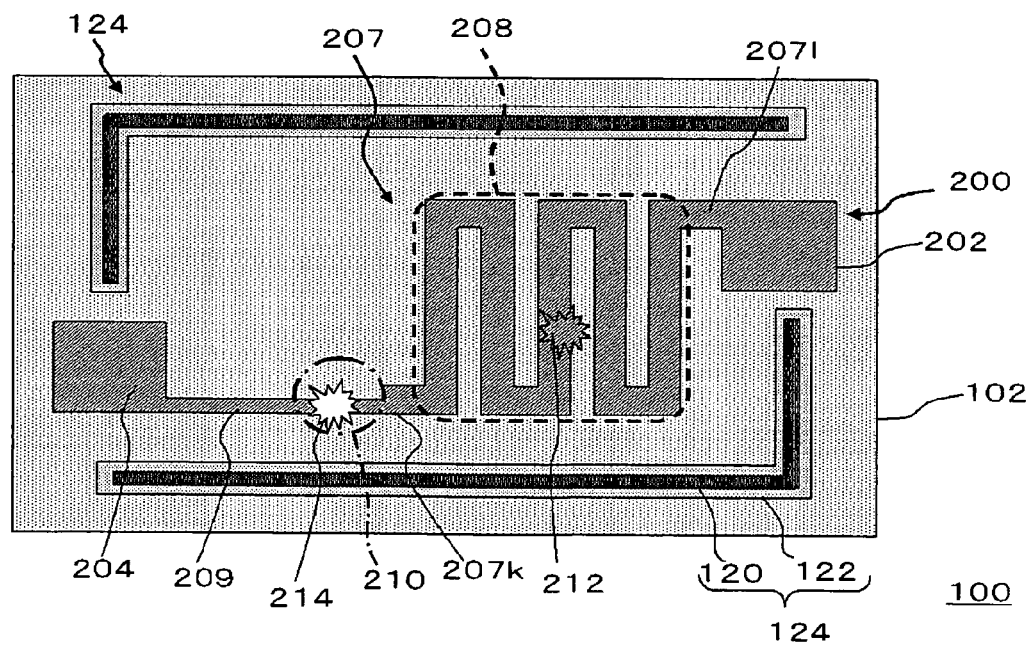

FIGS. 15A and 15B are plan views showing another example of the configuration of the semiconductor device 100 in the present embodiment. FIG. 15A shows one example of the configuration of the electric fuse 200 before cutting. FIG. 15B shows one example of the configuration of the electric fuse 200 after cutting.

The electric fuse 200 of the present embodiment is different from that shown in FIG. 12 in a point that the narrow interconnect 209 is provided only on the side of the second terminal 204, and the wide interconnect 207 is directly connected to the first terminal 202. Here, a wide connecting portion 207*l*, a folded structure of the wide interconnect 207, the separation portion 207*k*, and the narrow interconnect 209 are connected in this order between the first terminal 202 and the second terminal 204.

In the above-described configuration, the expected cut region 210 is provided on the narrow interconnect 209. Moreover, there is a high possibility that the cut part 214 is formed on the narrow interconnect as shown in FIG. 15B.

Moreover, the semiconductor device 100 has a configuration in which the electric fuse 200 is covered with a cover member 124, wherein the cover member 124 has an upper surface, lower surface, and a side surfaces, which are formed with a second conductive material different from the conductive member 206 forming the electric fuse 200.

Hereinafter, the configuration of the cover member 124 will be explained. The cover member 124 includes via 120, electrodes 122, and plates (not shown). The electrode 122 may be formed as a pad electrode which is formed with the same level as that of the conductive member 206 in the electric fuse 200. Moreover, the via 120 is formed on the upper layer and the lower layer of the electrode 122, and, furthermore, connects plates formed on the upper layer and the lower layer, and the electrode 122. The via 120 may be of a slit via, and the via 120 and the electrode 122 may be configured to cover the surrounding of the conductive member 206 like a wall.

Thereby, heat is generated in the electric fuse 200 when an electric current is applied to between the first terminal 202 and the second terminal 204. And the heat may be confined in the inside of the cover member 124 by reflecting the heat with the cover member 124. Accordingly, the semiconductor device 100 may have a configuration in which a crack 110 may be easily generated, and, at the same time, the conductive member 206 may be easily cut. Moreover, when the conductive member 206 is cut, the material forming the conductive member 206 may be prevented by using the cover member 124 from being scattered in the surrounding. Thereby, scattered matters of the material forming the conductive member 206 may be prevented from reaching other elements.

Here, though the cover member 124 may have a structure, as explained above, in which the top surface, the bottom one, the right side one, and the left side one of the electric fuse 200 maybe completely enclosed. However, the structure is not limited to the above one, and, for example, a structure in which only a part of the electric fuse 200 is covered may be applied.

Though the above description has been given on the configuration in which the narrow interconnect 209 is provided only on the side of the second terminal 204, there may be applied a configuration in which the narrow interconnect 209 is provided only on the side of the first terminal 202.

Figure 16:
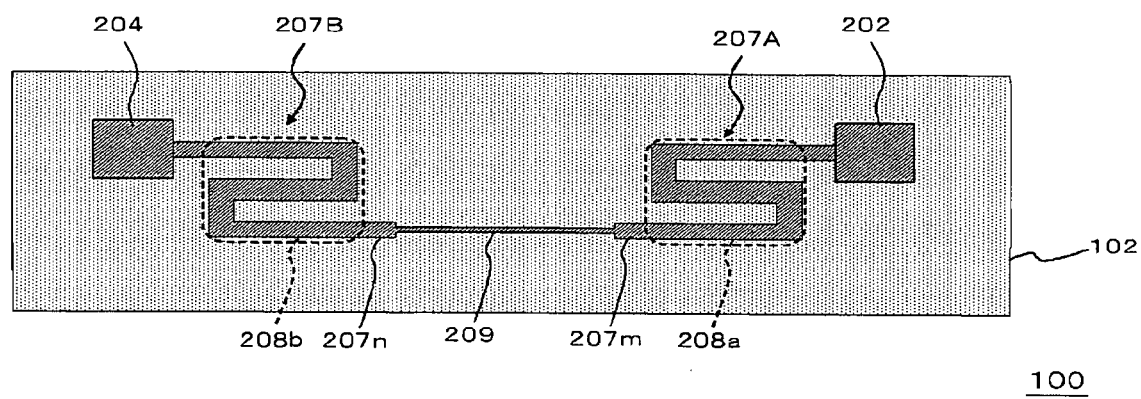
FIG. 16 is a plan view showing another example of the configuration of the semiconductor device according to the embodiment of the present invention.

FIG. 16 is a plan view showing one example of the configuration of the semiconductor device 100 according to the present embodiment. The drawing shows one example of the configuration of the electric fuse 200 before cutting.

In the electric fuse 200, a wide interconnect 207A with the folded structure is connected to the first terminal 202, a wide interconnect 207B with the folded structure is connected to the second terminal 204, and the narrow interconnect 209 is provided between the wide interconnect 207A and the wide interconnect 207B. The wide interconnect 207A has a structure in which the separation portion 207m is provided at the connecting portion to the narrow interconnect 209, and the wide interconnect 207B has a structure in which the separation portion 207n is provided at the connecting portion to the narrow interconnect 209.

According to the above-described configuration, the fuse forming material may easily flow out in the expected flowing-out region 208a of the wide interconnect 207A and in the expected flowing-out region 208b of the wide interconnect 207B. When the fuse forming material flows out in both of the expected flowing-out region 208a and the expected flowing-out region 208b, the fuse forming material moves to both sides in the narrow interconnect 209 to easily form a larger cut part. Here, when a narrow interconnect is provided in both of the expected flowing-out regions 208a and 208b, cutting is easily generated thereon. When a method by which a part of the electric fuse 200 flows out to cut the electric fuse 200 is used, and if the flowing-out region and the cut part are not separated from each other, there is a possibility, as described above, that a short circuit between the interconnects is generated at a location excluding the cut part. In the present embodiment, the flowing-out region of the fuse forming material and the cut part of the electric fuse 200 may be formed at different places from each other, because the narrow interconnect 209 is arranged away from the expected flowing-out regions 208a, using the separation portion 207m and away from the expected flowing-out region 208b, using the separation portion 207n.

Figure 17A:
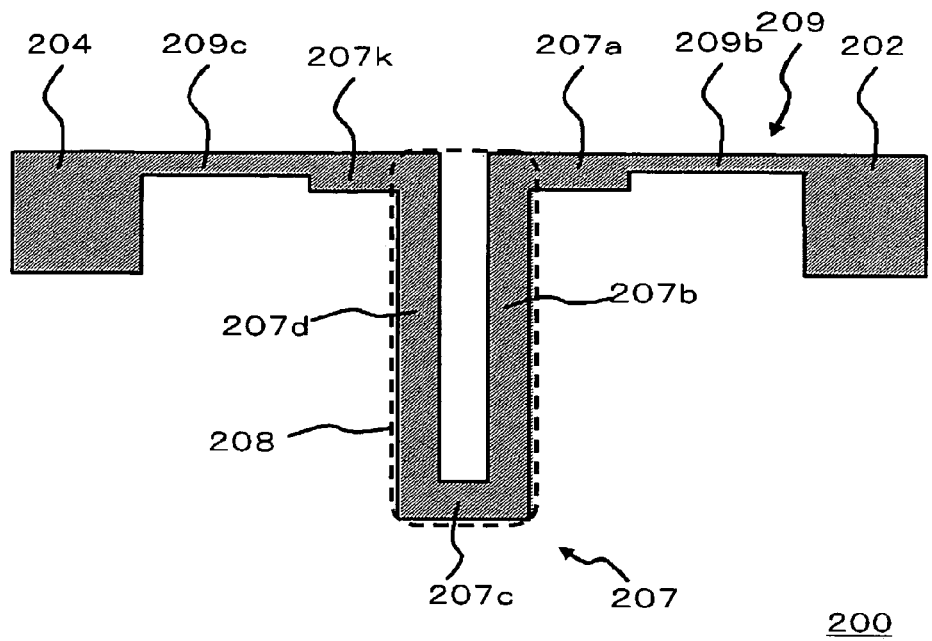
FIGS. 17A and 17B are plan views showing further another example of the configuration of the electric fuse.
Figure 17B:
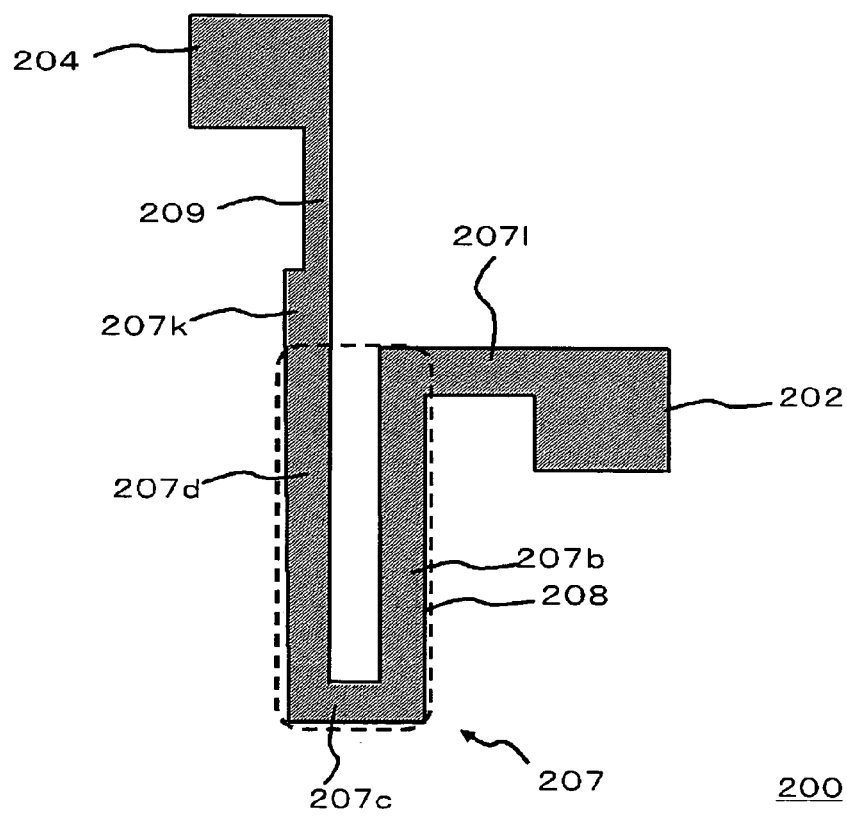

Moreover, though the above-described embodiments have shown the configuration in which the wide interconnect 207 is folded a plurality of times, the electric fuse 200 may have a configuration in which the wide interconnect 207 is folded only once in the expected flowing-out region 208. As the wide straight line portion 207b and the wide straight line portion 207d are adjacent to each other even in the configuration in which the wide interconnect 207 is folded only once as shown in FIGS. 17A and 17B, the fuse forming material is easily heated at the location in which the portions are adjacent to each other, and flows out with a higher possibility. As cutting may be configured not to be generated in the expected flowing-out region 208 by widening the width of the wide interconnect 207, a short circuit between interconnects may be prevented without a widened distance between the wide straight line portions 207b and 207d. There may be applied a configuration in which the narrow interconnect 209 is provided only on the side of the second terminal 204 as shown in FIG. 17B. Here, the first terminal 202 is connected to the wide straight line portion 207b through the wide connecting portion 207l. Moreover, there may be adopted a configuration in which the narrow interconnect 209 is provided only on the side of the first terminal 202, though the configuration is not shown.

As described above, according to the semiconductor device 100 in the present embodiment, the material forming may easily flow out to the outside by promoted crack generation, and, at the same time, a cut part may be formed separated from the flowing-out region, when the electric fuse 200 is cut by the crack assist type cutting, to prevent the electric fuse 200, which has been cut by short circuit between the interconnects, from conducting.

Though the embodiments according to the present invention have been described, referring to the drawings, the above embodiments are only illustrative and not restrictive, and various kinds of configurations excluding the above-described ones may be adopted.

In the above-described embodiments, there has been a configuration in which the first coating layer 106 is formed on the upper surface of the conductive member 206, and other portions excluding the above surface are covered with the second coating layer 104 as shown in FIG. 2. But the first coating layer 106 may be configured to be provided on portions excluding the upper surface of the conductive member 206. The semiconductor device 100 may have, for example, a configuration in which, in the cross-section in the stacking direction of the semiconductor substrate (not shown), the first coating layer 106 is formed on a part of regions on the surface of the conductive member 206, and, at the same time, the second coating layer 104 is formed on the other regions.

The semiconductor according to the present invention may have a configuration in which the surface, in the cross-sectional direction, of the conductive material forming the electric fuse is covered with at least two kinds of layers with different young's module, and, at the same time, there are included cracks which are generated in layers with a small young's modulus together with energization of the electric fuse, and a cut part which is generated at a location not included in regions in which the cracks have been generated. The electric fuse may be cut according to the crack assist type cutting because the fuse forming material is made selectively flow out from a coated part by coating at least a part of the surroundings of the conductive member 206 with a material softer than other parts.

Furthermore, though the configuration in which the semiconductor device 100 has the cover member 124 has been shown in the second embodiment, referring to FIGS. 15A and 15B, there may be applied even in other examples a configuration in which the semiconductor device 100 has the cover member 124.

Figure 18:
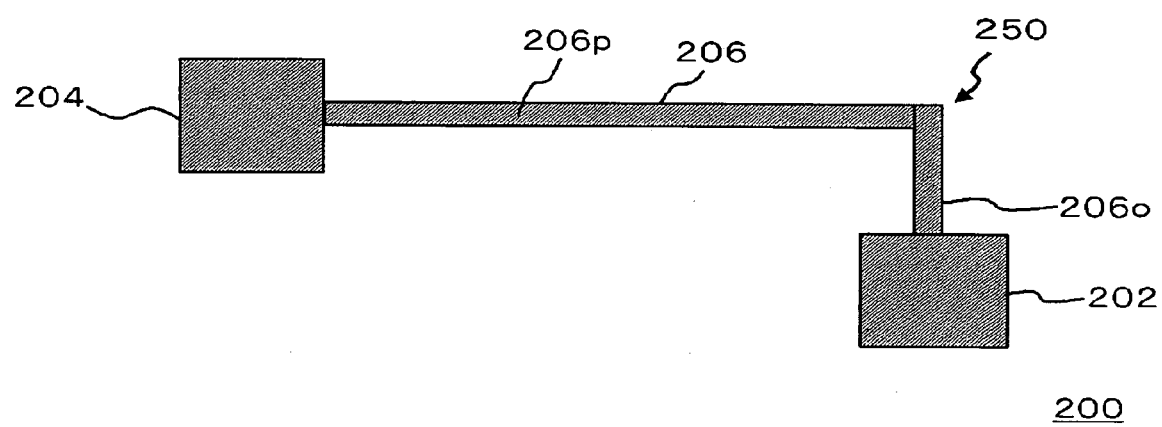
FIG. 18 is a plan view showing further another example of the configuration of the electric fuse.
Figure 19:
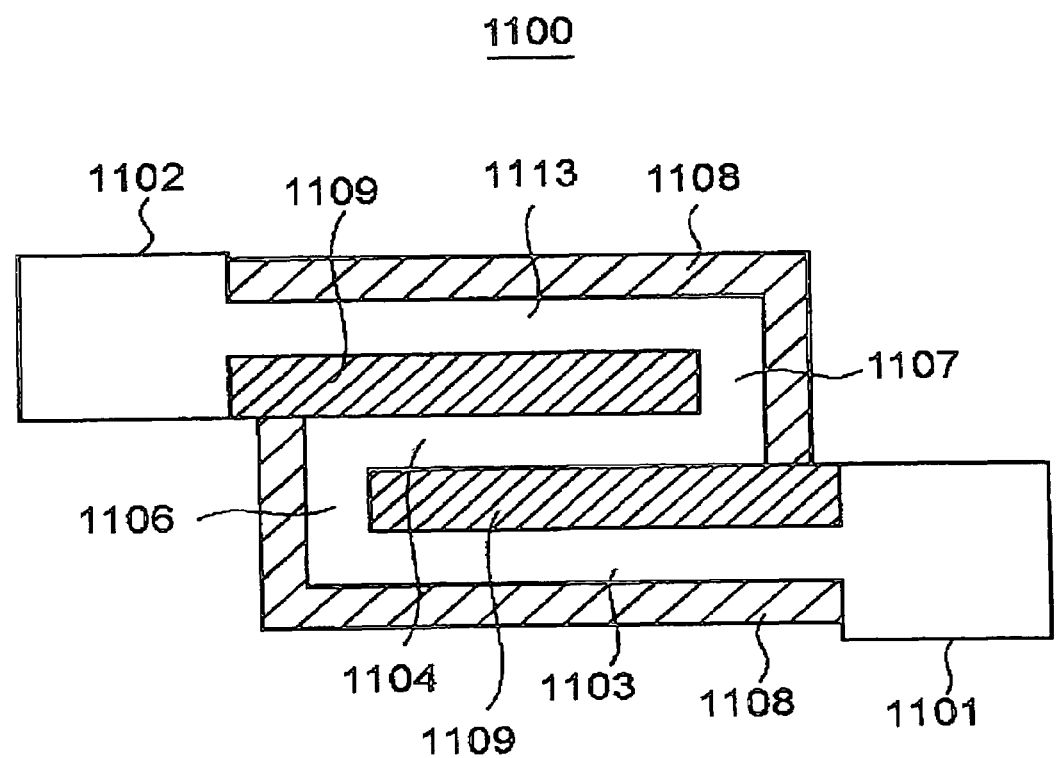
FIG. 19 is a top view showing one example of a conventional current fuse.

Moreover, the conductive member 206 may include a bent portion 250, a straight line portion 206o (first region) divided by the bent portion 250, and a straight line portion 206p (second region) on the surface plane of the semiconductor substrate (not shown) as shown in FIG. 18. Here, the straight line portions 206o and 206p are formed so that they have different lengths, and different areas on the surface plane of the substrate. Thereby, the conductive member 206 may be controlled in such a way that the fuse forming material easily flows out, for example, on the straight line portion 206p.

It is apparent that the present invention is not limited to the above embodiment, and may be modified and changed without departing from the scope and spirit of the invention.

What is claimed is:

1. A semiconductor device, including:
    a semiconductor substrate;
    a first insulating layer which is formed on said semiconductor substrate and formed with a concave portion; and
    an electric fuse which has a conductive member, a first terminal provided on one end of said conductive member and a second terminal provided on the other end of said conductive member, said electric fuse being formed on said first insulating layer such that said concave portion of said first insulating layer is embedded with said conductive member, and said conductive member having a flowing-out region in which a material forming said conductive member flows out into the outside of said concave portion and being cut at a location different from said flowing-out region.

2. The semiconductor device according to claim 1,
    wherein said conductive member includes a copper containing metal film including copper as a main constituent.

3. The semiconductor device according to claim 1 further including:
    a first coating layer formed on the upper surface of said conductive member,
    wherein said first coating layer includes a material different from a material formed on the surroundings excluding the region in contact with said first coating layer of said conductive member in the cross-section in the stacking direction of said semiconductor substrate.

4. The semiconductor device according to claim 1, further including:
    a first coating layer formed on said conductive member; and
    a second coating layer which is formed on the side surface and the bottom surface of said concave portion and is different from said first coating layer,
    wherein said conductive member is formed on said second coating layer in said concave portion.

5. The semiconductor device according to claim 4, further including;
    a second insulating layer which includes a material with a young's modulus lower than that of said first coating layer, and is formed on said first coating layer.

6. The semiconductor device according to claim 1,
    wherein in a cross-section in the stacking direction of said semiconductor substrate, a first coating layer is formed on a part of regions on the surface of said conductive member, and a second coating layer different from said first coating layer is formed on the other regions on the surface of said conductive member.

7. The semiconductor device according to claim 4,
    wherein said first coating layer is formed with a material with a young's modulus lower than that of said second coating layer.

8. The semiconductor device according to claim 3,
    wherein a crack is formed on said first coating layer, and a material forming said conductive member flows out into said crack to form said flowing-out region.

9. The semiconductor device according to claim 1,
    wherein said conductive member includes a bent portion, a first region, and a second region when viewing the surface plane of said semiconductor substrate, and said first region, and said second region are divided by said bent portion, and have different areas from each other.

10. The semiconductor device according to claim 1,
    wherein said conductive member includes a first straight line portion, a second straight line portion, and a connecting portion connecting said first straight line portion and said second straight line portion when viewing the surface plane of said semiconductor substrate, and said first and said second straight line portions are arranged approximately in parallel with each other.

11. The semiconductor device according to claim 10,
    wherein said connecting portion has an area size different from that of at least either of said first straight line portion or said second straight line portion when viewing the surface plane of said semiconductor substrate.

12. The semiconductor device according to claim 10,
    wherein said first and said second straight line portions are provided with a distance three times or more as the line width of said conductive member.

13. A semiconductor device, including:
    a semiconductor substrate;
    a first insulating layer which is formed on said semiconductor substrate and formed with a concave portion; and
    an electric fuse which has a conductive member, a first terminal provided on one end of said conductive member and a second terminal provided on the other end of said conductive member, said electric fuse being provided on said first insulating layer such that said concave portion of said first insulating layer is embedded with said conductive member, and said conductive member having an expected flowing-out region in which a material forming said conductive member flows out into the outside of said concave portion when an electric current exceeding a predetermined current value is applied to between said first and said second terminals, and an expected cut region which is cut, based on a configuration in which said material flows out from said expected flowing-out region and said material in said concave portion moves in the direction to said expected flowing-out region.

14. The semiconductor device according to claim 13,
    wherein said conductive member includes a copper containing metal film including copper as a main constituent.

15. The semiconductor device according to claim 13, further including:
    a first coating layer formed on the upper surface of said conductive member; and
    a second coating layer which is formed on the side surface and the bottom surface of said concave portion, and is different from said first coating layer,
    wherein said conductive member is formed on said second coating layer in said concave portion.

16. The semiconductor device according to claim 15, further including
    a second insulating layer which includes a material with a young's modulus lower than that of said first coating layer, and is formed on said first coating layer.

17. The semiconductor device according to claim 15,
wherein said first coating layer is formed with a material with a young's modulus lower than that of said second coating layer.

18. The semiconductor device according to claim 1,
wherein said first terminal is electrically connected to a power supply, and said second terminal is connected to the source/drain of a transistor.

19. A method of manufacturing a semiconductor device including an electric fuse which is formed on a semiconductor substrate, and has a conductive member, a first terminal provided on one end, and a second terminal provided on the other end of said conductive member, said electric fuse being formed on a first insulating layer such that a concave portion of said first insulating layer is embedded with said conductive member, and said conductive member having a flowing-out region in which a material forming said conductive member flows out into the outside of said concave portion and being cut at a location different from said flowing-out region, said method including applying an electric current to said conductive member by applying a predetermined voltage to between said first terminal and said second terminal of said electric fuse, wherein in said applying an electric current to said conductive member, said conductive member is cut in regions different from one region, based on a configuration in which a material forming said conductive member flows out in one region of said conductive member and said material is moved in the direction to said one region.

20. The method of manufacturing a semiconductor device according to claim 19, wherein said applying an electric current to said conductive member includes:

giving high potential to said first terminal; and giving low potential to said second terminal thereafter.

* * * * *